US011618681B2

(12) United States Patent
Arnold et al.

(10) Patent No.: US 11,618,681 B2
(45) Date of Patent: Apr. 4, 2023

(54) GRAPHENE NANORIBBONS GROWN FROM AROMATIC MOLECULAR SEEDS

(71) Applicant: Wisconsin Alumni Research Foundation, Madison, WI (US)

(72) Inventors: Michael Scott Arnold, Middleton, WI (US); Austin James Way, Madison, WI (US); Robert Michael Jacobberger, Evanston, IL (US)

(73) Assignee: Wisconsin Alumni Research Foundation, Madison, WI (US)

( * ) Notice: Subject to any disclaimer, the term of this patent is extended or adjusted under 35 U.S.C. 154(b) by 108 days.

(21) Appl. No.: 17/360,108

(22) Filed: Jun. 28, 2021

(65) Prior Publication Data
US 2022/0411268 A1 Dec. 29, 2022

(51) Int. Cl.
*C01B 32/186* (2017.01)
*C30B 29/54* (2006.01)
(Continued)

(52) U.S. Cl.
CPC ............ *C01B 32/186* (2017.08); *C30B 29/02* (2013.01); *C30B 29/54* (2013.01); *C30B 29/60* (2013.01);
(Continued)

(58) Field of Classification Search
CPC ............ C01B 32/186; C01B 2204/065; C01B 32/182; C01B 32/184; C01B 32/188; C01B 32/19; C01B 32/192; C01B 32/194; C01B 32/196; C01B 32/198; C01B 2204/00; C01B 2204/02; C01B 2204/04; C01B 2204/06; C01B 2204/20; C01B 2204/22; C01B 2204/24; C01B 2204/26; C01B 2204/28; C01B 2204/30; C01B 2204/32;
(Continued)

(56) References Cited

U.S. PATENT DOCUMENTS 9,287,359 B1 3/2016 Arnold et al.
9,324,804 B2 4/2016 Ally et al.
(Continued)

FOREIGN PATENT DOCUMENTS

EP 2540662 1/2013
EP 2780280 B1 1/2018
(Continued)

OTHER PUBLICATIONS

Way, et al., Seed-Initiated Anisotropic Growth of Unidirectional Armchair Graphene Nanoribbon Arrays on Germanium, Nano Lett. 2018; 18: 898-906 (Year: 2018).*
(Continued)

*Primary Examiner* — Daniel C. McCracken
(74) *Attorney, Agent, or Firm* — Bell & Manning, LLC

(57) ABSTRACT

Methods for the bottom-up growth of graphene nanoribbons are provided. The methods utilize small aromatic molecular seeds to initiate the anisotropic chemical vapor deposition (CVD) growth of graphene nanoribbons having low size polydispersities on the surface of a growth substrate. The aromatic molecular seeds include polycyclic aromatic hydrocarbons (PAHs), functionalized derivatives of PAHs, heterocyclic aromatic molecules, and metal complexes of heterocyclic aromatic molecules.

16 Claims, 14 Drawing Sheets

(51) Int. Cl.
  *C30B 29/02* (2006.01)
  *C30B 29/60* (2006.01)
  *B82Y 40/00* (2011.01)
(52) U.S. Cl.
  CPC ......... *B82Y 40/00* (2013.01); *C01B 2204/065* (2013.01); *C01P 2004/17* (2013.01); *C01P 2004/64* (2013.01)
(58) Field of Classification Search
  CPC ....... C01B 32/20; C01B 32/205; C01B 32/21; C01B 32/215; C01B 32/22; C01B 32/225; C01B 32/23; C30B 29/02; C30B 29/54; C30B 29/60; B82Y 40/00; C01P 2004/17; C01P 2004/64
  See application file for complete search history.

(56) References Cited

U.S. PATENT DOCUMENTS

| | | |
|---|---|---|
| 9,761,669 B1 | 9/2017 | Arnold et al. |
| 2010/0200840 A1 | 8/2010 | Anderson et al. |
| 2010/0255219 A1 | 10/2010 | Wenxu et al. |
| 2011/0114919 A1 | 5/2011 | Jenkins et al. |
| 2011/0244662 A1 | 10/2011 | Lee et al. |
| 2012/0003438 A1 | 1/2012 | Appleton et al. |
| 2012/0068157 A1 | 3/2012 | Kub |
| 2012/0085991 A1 | 4/2012 | Cohen et al. |
| 2012/0141799 A1 | 6/2012 | Kub et al. |
| 2012/0181507 A1 | 7/2012 | Dimitrakopoulos et al. |
| 2012/0261644 A1 | 10/2012 | Dimitrakopoulos |
| 2013/0027778 A1 | 1/2013 | Currie et al. |
| 2013/0099195 A1 | 4/2013 | Seacrist et al. |
| 2013/0099205 A1 | 4/2013 | Liu et al. |
| 2013/0108839 A1 | 5/2013 | Arnold et al. |
| 2013/0160701 A1 | 6/2013 | Arnold et al. |
| 2014/0264281 A1 | 9/2014 | Niyogi et al. |
| 2015/0037048 A1 | 2/2015 | Na et al. |
| 2015/0225244 A1* | 8/2015 | Hintermann ........... B82Y 30/00 423/448 |
| 2015/0268110 A1* | 9/2015 | Schwartz .............. F16C 19/522 73/788 |

FOREIGN PATENT DOCUMENTS

| | | |
|---|---|---|
| JP | 2012-172065 | 9/2012 |
| WO | WO2017/064113 | 4/2017 |

OTHER PUBLICATIONS

Way, et al., Anisotropic Synthesis of Armchair Graphene Nanoribbon Arrays from Sub-5 nm Seeds at Variable Pitches on Germanium, J. Phys. Chem. Lett. 2019; 10: 4266-4272 (Year: 2019).*
Wang et al., "Ethene to Graphene: Surfaced Catalyzed Chemical Pathways, Intermediates, and Assembly," *J. Phys. Chem. C.* 2017, 121, 9413-9423.
Wan et al., "High Quality Large-Area Graphene from Dehydrogenated Polycyclic Aromatic Hydrocarbons," *Chem. Mater.* 2012, 24, 3906-3915.
Talyzin et al., "Synthesis of Graphene Nanoribbons Encapsulated in Single-Walled Carbon Nanotubes," *Nano Lett.* 2011, 11, 4352-4356.
Jaccobberger et al., "Alignment of semiconducting graphene nanoribbons on vicinal Ge(001)," *J. Name.*, 2013, 00, 1-3.
Tong et al., "Metal Phthalocyanine Nanoribbons ana Nanowires," *J. Phys. Chem. B.* 2006, 110, 17406-17413.
Zuzak et al., "Extended iron phthalocyanine islands self-assembled on a Ge(001):H surface," *Beilstein J. Nanotechnol.* 2021, 12, 232-241.
Zhuo et a., "Seed-Assisted Synthesis of Graphene Films on Insulating Substrate," *Materials*, 2019, 12, 1376.
Hersam et al., "Silicon-based molecular nanotechnology," *Nanotechnology* 11 (2000) 70-76.

Way, Austin J., Robert M. Jacobberger, and Michael S. Arnold. "Seed-initiated anisotropic growth of unidirectional armchair graphene nanoribbon arrays on germanium." Nano letters 18.2 (2018): 898-906.
Way, Austin J., et al. "Anisotropic Synthesis of Armchair Graphene Nanoribbon Arrays from Sub-5 nm Seeds at Variable Pitches on Germanium." The journal of physical chemistry letters 10.15 (2019): 4266-4272.
Wang et al., Direct Growth of Graphene Film on Germanium Substrate, Scientific Reports, vol. 3, No. 2465, Aug. 19, 2013.
Prabhakaran et al., Distinctly different thermal decomposition pathways of ultrathin oxide layer on Ge and Si surfaces, Applied Physics Letters, vol. 76, No. 16, Apr. 17, 2000, pp. 2244-2246.
Nazarenkov et al., Mechanism of photo-stimulated processes in $GeO_x$ films, Thin Solid Films, vol. 254, 1995, pp. 164-168.
A. Toriumi, Recent Progress of Germanium MOSFETs, 2012 IEEE International Meeting for Future of Electron Devices, Kansai (IMFEDK), Osaka, May 9, 2012, pp. 1-2.
Wang et al., Germanium nanowire field-effect transistors with $SiO_2$ and high-k $HfO_2$ gate dielectrics, Applied Physics Letters, vol. 83, No. 12, Sep. 22, 2003, pp. 2432-2434.
K. Saraswat, Novel Electronic and Optoelectronic Devices in Germanium Integrated on Silicon, ECS Transactions, vol. 33, No. 6, 2010, pp. 101-108.
Saraswat et al., High performance germanium MOSFETs, Materials Science and Engineering B, vol. 135, 2006, pp. 242-249.
Toriumi et al., Material Potential and Scalability Challenges of Germanium CMOS, 2011 IEEE International Electron Devices Meeting (IEDM), Washington, DC , Dec. 5, 2011, pp. 28.4.1-28.4.4.
Y. Kamata, High-k/Ge MOSFETs for future nanoelectronics, materials today, vol. 11, No. 1 -2, Jan. 2008, pp. 30-38.
Brunco et al., Germanium MOSFET Devices: Advances in Materials Understanding, Process Development, and Electrical Performance, Journal of The Electrochemical Society, vol. 155, No. 7, May 23, 2008, pp. H552-H561.
Chui et al., A Sub-400°C Germanium MOSFET Technology with High-K Dielectric and Metal Gate, International Electron Devices Meeting, 2002. IEDM '02, San Francisco, CA, Dec. 8, 2002, pp. 437-440.
Klekachev et al., Graphene Transistors and Photodetectors, The Electrochemical Society Interface, vol. 22, No. 1, Spring 2013, pp. 63-68.
Bodlaki et al., Ambient stability of chemically passivated germanium interfaces, Surface Science, vol. 543, 2003, pp. 63-74.
Boztug et al., Strained-Germanium Nanostructures for Infrared Photonics, ACS Nano, vol. 8, No. 4, Mar. 5, 2014, pp. 3136-3151.
Cooper et al., Experimental Review of Graphene, International Scholarly Research Network Condensed Matter Physics, vol. 2012, article ID 501686, 2012, pp. 1-56.
Online Disclosure for P130002US01, Available online prior to Mar. 21, 2014.
Li et al., Synthesis, Characterization, and Properties of Large-Area Graphene Films, ECS Transactions, vol. 19, No. 5, 2009, pp. 41-52.
Brey, L., et al., "Electronic states of graphene nanoribbons studied with the Dirac equation," *Physical Review* (Jun. 15, 2006), vol. 73, 235411, 5 pp. See, abstract and figure 1.
Chung, H.C., et al., "Exploration of edge-dependent optical selection rules for graphene nanoribbons," *Optic Express* (Nov. 1, 2011) (Online), vol. 19, pp. 23351-23363. See, abstract and figure 1.
International Search Report & Written Opinion dated Oct. 30, 2015, for Intl. Patent Appl. No. PCT/US2015/049325, 11 pp.
Biro et al., Nanopatterning of graphene with crystallographic orientation control, Carbon, vol. 48, Apr. 14, 2010, pp. 2677-2689.
Nemes-Incze et al., Graphene nanoribbons with zigzag and armchair edges prepared by scanning tunneling microscope lithography on gold substrates microscope lithography on gold substrates, Applied Surface Science, vol. 291, Nov. 13, 2013, pp. 48-52.
Wang et al., Etching and Narrowing of Graphene from the Edges, Nature Chemistry, vol. 2, Jun. 27, 2010, pp. 661-665.
Murdock et al., Controlling the Orientation, Edge Geometry, and Thickness of Chemical Vapor Deposition Graphene, ACS Nano, vol. 7, No. 2 , Jan. 24, 2013, pp. 1351-1359.

(56) References Cited

OTHER PUBLICATIONS

Wu et al., Growth of Single crystal Graphene Arrays by Locally Controlling Nucleation on Polycrystalline Cu Using Chemical Vapor Deposition, Adv. Mater., 23, Sep. 23, 2011, pp. 4898-4903.

Yu et al., Control and characterization of individual grains and grain boundaries in graphene grown by chemical vapour deposition, Nature Materials, vol. 10, May 8, 2011, pp. 443-449.

Jacobberger et al., Direct oriented growth of armchair graphene nanoribbons on germanium, Nature Communications | 6:8006, Aug. 10, 2015, pp. 1-8.

Lippert et al., Graphene Grown on Ge(001) from Atomic Source, Obtained online from Cornell University Library, published prior to Mar. 21, 2014.

T. Wogan, Growing great graphene on germanium, Chemistry World, http://www.rsc.org/chemistryworld/2014/04/growing-great-graphene-germanium-defect-free-electronics, Apr. 3, 2014.

Lee et al., Wafer-Scale Growth of Single-Crystal Monolayer Graphene on Reusable Hydrogen-Terminated Germanium, Science, vol. 344, Apr. 3, 2014, pp. 286-289.

\* cited by examiner

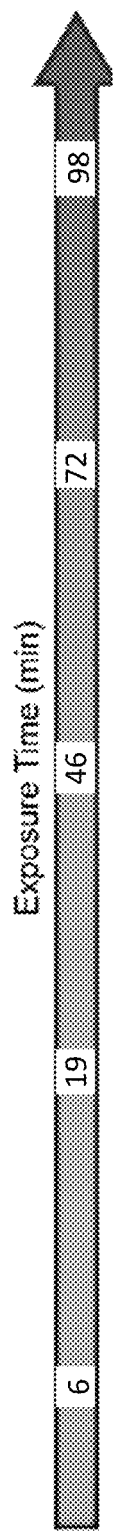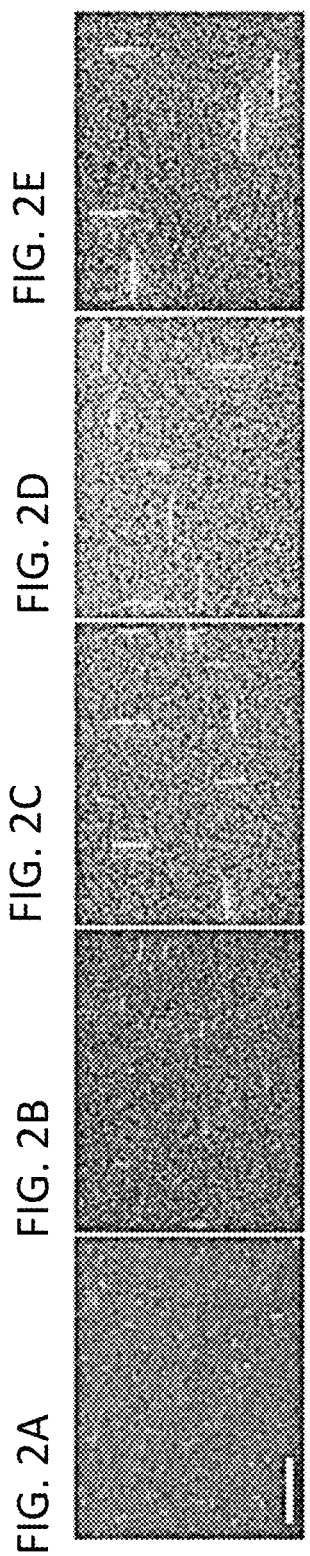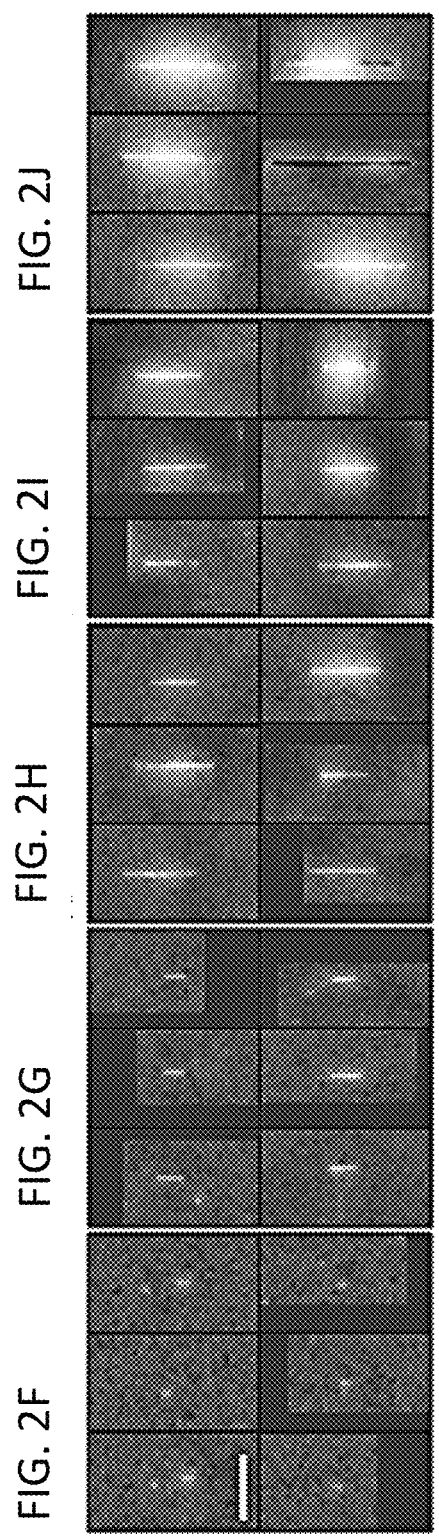

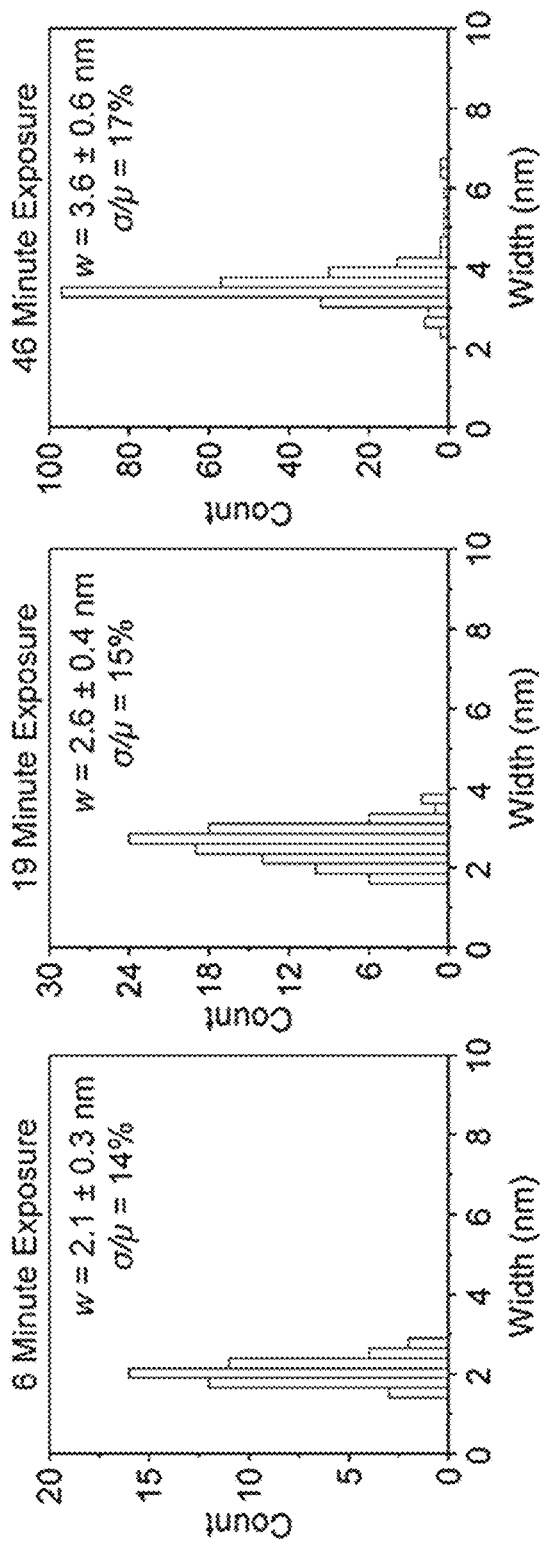
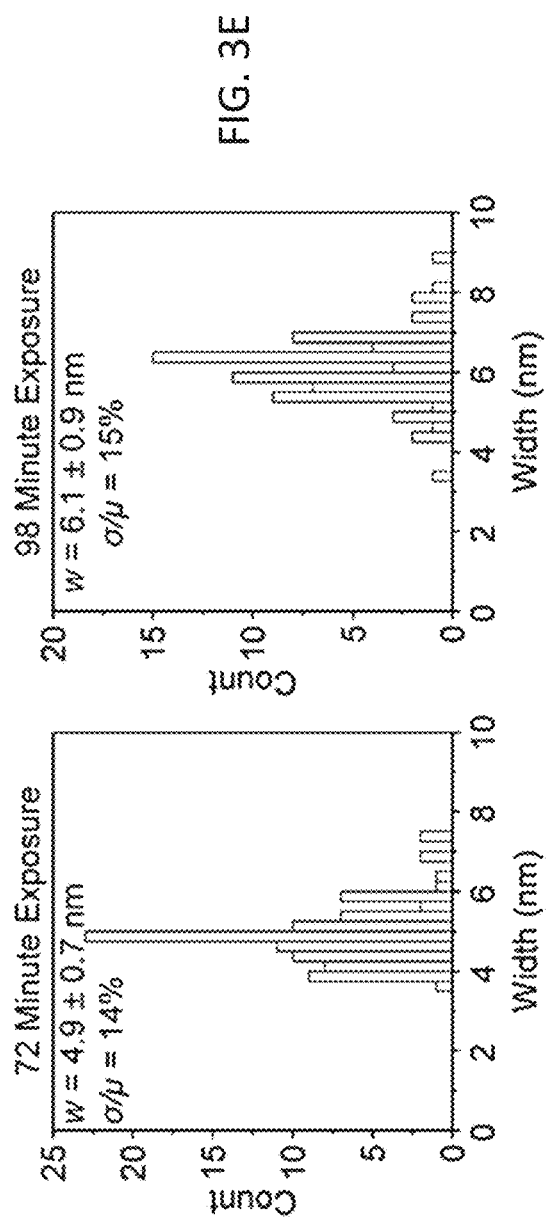
FIG. 3A FIG. 3B FIG. 3C FIG. 3D FIG. 3E

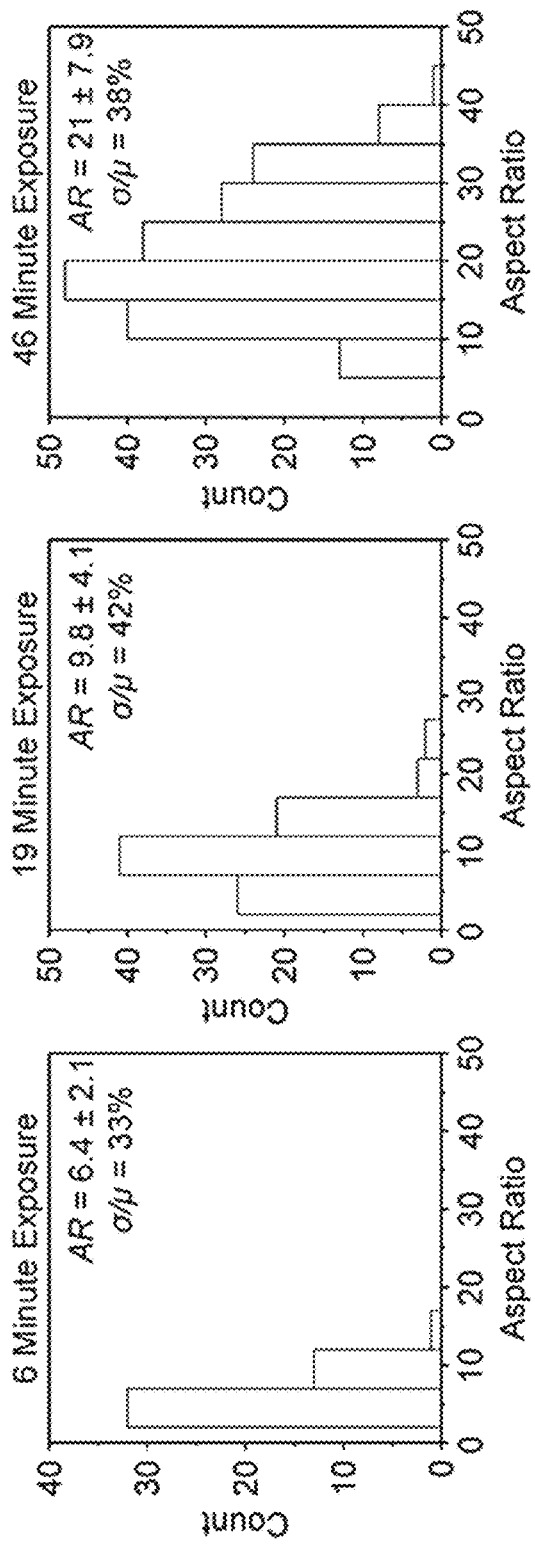
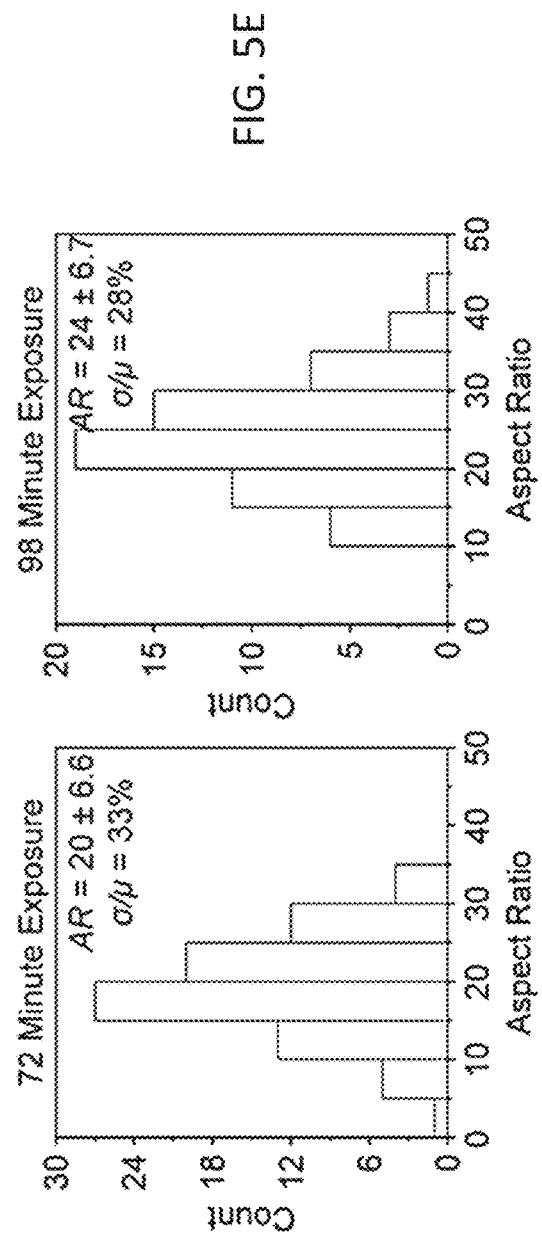
FIG. 5A  FIG. 5B  FIG. 5C  FIG. 5D  FIG. 5E

GRAPHENE NANORIBBONS GROWN FROM AROMATIC MOLECULAR SEEDS

REFERENCE TO GOVERNMENT RIGHTS

This invention was made with government support under DE-SC0016007 awarded by the U.S. Department of Energy and under W911NF-12-1-0025 awarded by the ARMY/ARO. The government has certain rights in the invention.

BACKGROUND

Semiconducting graphene nanoribbons are promising candidates for succeeding and/or complementing silicon (Si) in logic microprocessors and Group III-V compounds in radio frequency devices and for integrating into emerging thin film, optoelectronic, spintronic, and quantum devices because of their large current-carrying capacity, high carrier velocity, bandgap tunability, and outstanding thin-body electrostatic control. To meet the demands of most of these applications, nanoribbons narrower than 5 nm are desirable as they can have technologically relevant bandgaps arising from quantum confinement effects. The fabrication of nanoribbons this narrow is challenging and has been pursued via lithography and etching, chemical/mechanical exfoliation of graphite, unzipping carbon nanotubes, synthesis templated within hexagonal boron nitride trenches or at SiC step edges, and on-surface or solution-phase polymerization. While many of these avenues are promising, numerous challenges remain including precise control over width, length, orientation, registration, and edge termination; periodic array formation; device integration; and translation to technologically relevant substrates. Substantial fundamental discovery of new synthetic strategies is needed before it will be possible to fully exploit nanoribbons in technology.

One promising strategy is to grow nanoribbons by chemical vapor deposition (CVD) on surfaces that promote highly anisotropic growth kinetics. The anisotropic graphene evolution results in nanoribbons self-aligned along Ge⟨110⟩ and with faceted armchair edges. A major challenge, however, has been nanoribbon-to-nanoribbon width variation. This polydispersity arises in large part because the nanoribbons do not nucleate simultaneously or uniformly. (Jacobberger, R. M. et al., Nat. Commun. 2015, 6, 8006; Kiraly, B. et al., Appl. Phys. Lett. 2016, 108, 213101; and Way, A. J. et al., Nano Lett. 2018, 18, 898-906.) One possible solution to this challenge is to employ seeds to initiate the synthesis of all nanoribbons at the same time from a more consistent nucleus. Seeds fabricated lithographically by etching graphene have been used towards this end. (Way, 2018; and Way, A. J. et al., J. Phys. Chem. Lett. 2019, 10, 4266-4272.) However, to synthesize sub 5 nm nanoribbons, sub 5 nm seeds should be used, which is a length scale difficult to access by contemporary lithography.

SUMMARY

Methods for the formation of graphene nanoribbons via seeded anisotropic chemical vapor deposition growth are provided.

One example of a method of growing graphene nanoribbons includes the steps of: depositing aromatic molecular seeds from the gas phase onto a surface of a growth substrate; and growing graphene nanoribbons from the aromatic molecular seeds via chemical vapor deposition. The aromatic molecular seeds may comprise, for example, polycyclic aromatic hydrocarbons (PAHs), functionalized derivatives of PAHs, heterocyclic aromatic molecules, metal complexes of heterocyclic aromatic molecules, or a combination thereof.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1A shows a schematic diagram of the two main stages. (i) PAH molecules are deposited at relatively low temperature onto Ge(001) from the vapor phase to form seeds. (ii) $CH_4$ is used to drive anisotropic growth via CVD and extend the seeds selectively along one direction, at high temperature, to yield narrow, armchair graphene nanoribbons. FIG. 1B is a representative scanning electron microscopy (SEM) image of nanoribbons initiated from PTCDA-derived seeds after 173 min of $CH_4$ exposure. Scale bar is 200 nm.

FIGS. 2A-2L show anisotropic evolution from perylenetetracarboxylic dianhydride (PTCDA)-derived seeds. FIGS. 2A-2E show SEM images of nanoribbons after $CH_4$ exposure times of 6, 19, 46, 72, and 98 min. Scale bar is 200 nm. FIGS. 2F-2J show scanning tunneling microscopy (STM) images of nanoribbons after exposure times of 6, 19, 46, 72, and 98 min (applied bias=2 V, tunneling current=0.1 nA). Scale bar is 100 nm. FIGS. 2K-2L show plots of width and length versus exposure time. Lines are linear best fits. The open circle indicates where the linear fit intercepts the y-axis and defines the effective seed size of 1.7 nm.

FIGS. 3A-3E show further characterization of nanoribbon samples analyzed in FIGS. 2A-2L (initiated from PTCDA-derived seeds). Nanoribbon width distributions after 6 (FIG. 3A), 19 (FIG. 3B), 46 (FIG. 3C), 72 (FIG. 3D), and 98 (FIG. 3E) min of evolution from $CH_4$ are shown. The mean, standard deviation, and polydispersity ($\sigma/\mu$) are indicated in each panel.

FIG. 4A shows individual PAH molecules or fragments of PAH molecules grow relatively isotropically from $CH_4$ to a critical size before anisotropic nanoribbon evolution begins. FIG. 4B shows multiple PAH molecules or fragments of PAH molecules cluster to form seeds that are effectively larger in size (e.g., 1.7 nm for PTCDA, based on FIGS. 2A-2L data) that then initiate the anisotropic growth of nanoribbons.

FIGS. 5A-5E show further characterization of nanoribbon samples analyzed in FIGS. 2A-2L (initiated from PTCDA-derived seeds). Nanoribbon aspect ratio (AR) after 6 (FIG. 5A), 19 (FIG. 5B), 46 (FIG. 5C), 72 (FIG. 5D), and 98 (FIG. 5E) min of evolution from $CH_4$ are shown. The mean, standard deviation, and polydispersity ($\sigma/\mu$) are indicated in each panel.

FIG. 6A shows large area STM images of nanoribbons initiated from PTCDA-derived seeds after 46 min of $CH_4$ exposure (applied bias=2 V, tunneling current=0.1 nA). Scale bar is 200 nm. FIG. 6B shows a high magnification STM image of an individual nanoribbon (applied bias=2 V, tunneling current=0.1 nA). Scale bar is 10 nm. Features (indicated with white circles) 1, 2, and 3 mark $GeO_x$ species and/or adsorbates on the bare Ge surface encroaching upon or directly touching the nanoribbon edges (resulting from exposure of the substrate to ambient air during transfer from the CVD reactor to the STM chamber). Feature 4 highlights topographical variation in the Ge underneath the nanoribbons (resembling the shallow hills and valleys that become more prominent in wider nanoribbons because of the nanofaceting of the Ge(001) surface under graphene during synthesis). FIG. 6C shows a high magnification STM image of an individual nanoribbon (applied bias=0.2 V, tunneling current=1 nA). Scale bar is 3 nm. Features 5, 6, and 7 mark honeycomb, intervalley scattering with periodicity of $\lambda_f$, and $\sqrt{3}$ quasiparticle interference patterns, respectively, in the nanoribbon interior. FIGS. 6D-6F show width histograms of nanoribbons initiated without seeds, with pentacene-derived seeds, and with PTCDA-derived seeds after 46 min of $CH_4$ exposure. Mean ($\sigma$), standard deviation ($\mu$), and polydispersity ($\sigma/\mu$) are specified.

FIG. 8A shows nanoribbon FET architecture. FIGS. 8B-8C show source-drain current ($I_{ds}$) versus source-gate bias ($V_{gs}$) at a source-drain bias ($V_{ds}$) of −0.1 V for one FET (FIG. 8B) and three other (FIG. 8C) FETs for each nanoribbon width population. FIG. 8D shows histograms of off-state conductance ($G_{off}$). The median off-state conductance decreases by 2.1 orders of magnitude in the narrower ribbons. Dark grey and light grey data correspond to nanoribbons with average widths of 6.1 and 3.5 nm, respectively.

DETAILED DESCRIPTION

Figure 1A:
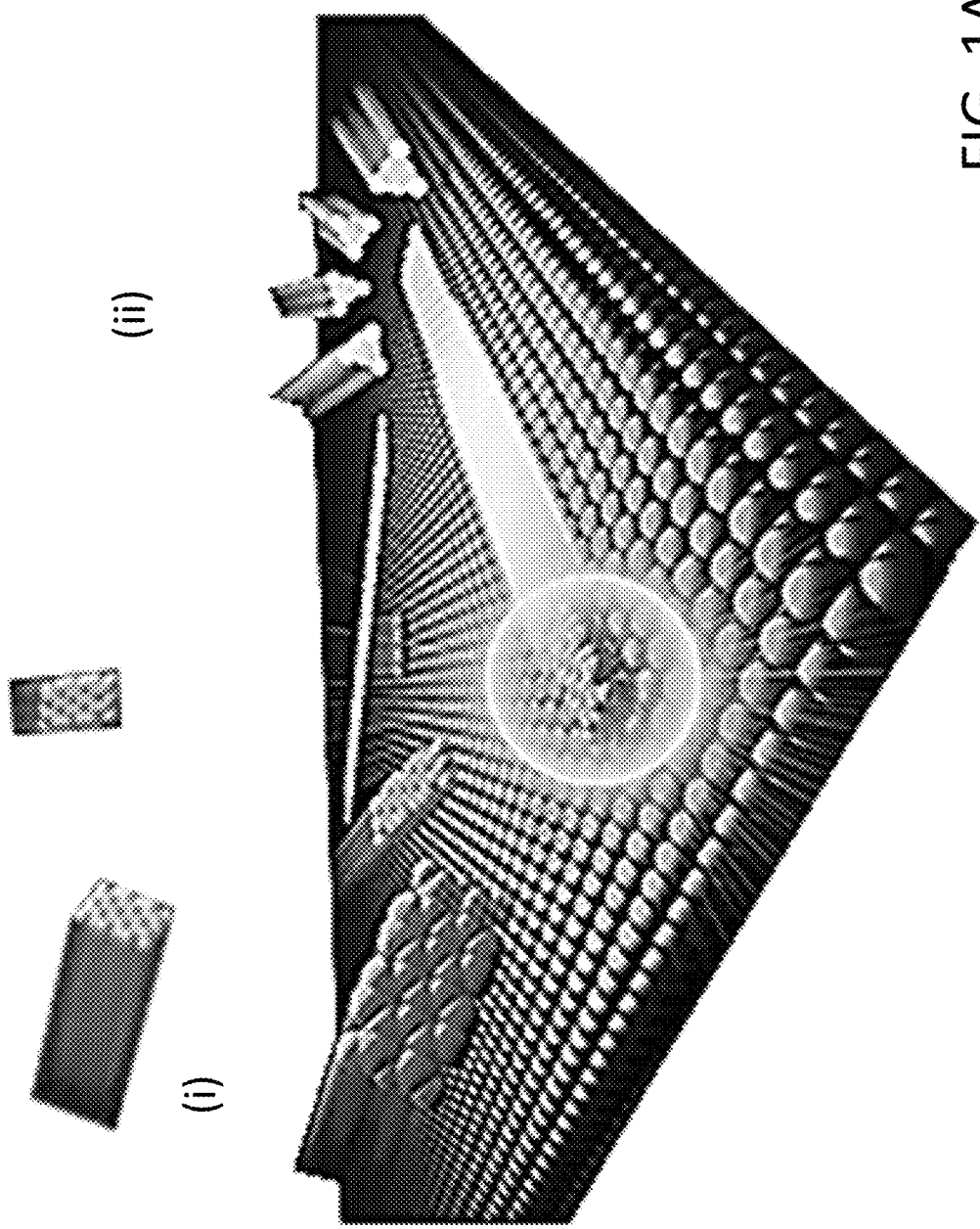
FIGS. 1A-1B show nanoribbon synthesis from molecularly derived seeds.

Methods for the bottom-up growth of graphene nanoribbons are provided. The graphene nanoribbons are narrow, elongated strips (or "ribbons") of monolayer graphene having widths and crystallographic edge structures that provide the ribbons with electronic properties, such as electronic bandgaps, that are absent in continuous two-dimensional films of graphene. The methods utilize small aromatic molecules to initiate the anisotropic chemical vapor deposition (CVD) growth of graphene nanoribbons having armchair edges and low size polydispersities on the (001) facet of a growth substrate. The methods overcome challenges associated with stochastic nanoribbon nucleation and the resulting graphene nanoribbon width polydispersity that have been observed for other bottom-up graphene nanoribbon growth methods.

The aromatic molecules used to initiate graphene nanoribbon growth, which are referred to herein as aromatic molecular seeds include polycyclic aromatic hydrocarbons (PAHs), functionalized derivatives of PAHs, heterocyclic aromatic molecules, and/or metal complexes of heterocyclic aromatic molecules.

In the methods, aromatic molecular seeds are deposited from the gas phase onto the (001) facet of a growth substrate. Chemical vapor deposition is then carried out under conditions that promote slow, anisotropic growth of graphene nanoribbons from the aromatic molecular seeds.

The substrates on which the graphene nanoribbons are grown (referred to herein as growth substrates) may be any substrate that surface that is catalytic for the CVD growth of graphene. Examples of such substrates include, but are not limited to, those having a (001) facet or a surface produced by miscutting a (001) surface at a small angle. Ge(001) and miscut Ge(001) are examples of such growth substrates. Others include GaAs(001) and miscut GaAs(001), and InAs (001) and miscut InAs(001).

The aromatic molecular seeds are desirably planar and some of the aromatic molecular seeds include one or more five-member, six-member, and/or seven-member rings of $sp^2$ hybridized carbon. The PAHs are hydrocarbon molecules containing two or more fused aromatic rings. Examples of PAHs that can be used include: linear acenes, such as anthracene, tetracene, pentacene, hexacene and their functionalized derivatives; circulenes, such as corannulene, coronene and hexabenzocoronene and their functionalized derivatives; and rylenes, such as, PTCDA, perylene, terrylene and quarterrylene and their functionalized derivatives.

The metal complexes of heterocyclic aromatic molecules, which may include both five- and six-member aromatic rings, have a central transition metal atom and ligands comprising heterocyclic aromatic rings and six-member aromatic carbon rings arranged around the central atom. Metal phthalocyanines and porphyrins, such as copper phthalocyanine blue, are examples of metal complexes of heterocyclic aromatic molecules that can be used. The CVD growth of a graphene nanoribbon from a metal complex of a heterocyclic aromatic molecule can be used to introduce a metal atom as a single "defect" in the graphene nanoribbon with controlled placement. This may be advantageous because single defects can add new functionalities to carbon nanostructures. By way of illustration, the Mn-, Co-, and Tb-phthalocyanines, which have five-membered rings, four-fold symmetry, and a metal center that can be resolved by scanning tunneling microscopy (STM), may be of interest due to the long-lived nuclear spin lifetimes of Mn, Co, and Tb.

The aromatic molecular seeds can be deposited by exposing the growth substrate to gas-phase aromatic molecular seeds. The aromatic molecular seeds can be introduced into the gas-phase via sublimation from a solid state or evaporation from a liquid state. For sublimation deposition, aromatic molecular seeds having sublimation temperatures below which the seed molecule decomposes should be used. may be preferred. During sublimation a solid aromatic molecular seed source is maintained at a temperature at or above its sublimation temperature. Similarly, during evaporation a liquid aromatic molecular seed source is maintained at a temperature sufficiently high to generate a vapor pressure of the molecular seed. Prior to the deposition of the aromatic molecular seeds, the growth substrate can be annealed to remove any carbon-based contaminants or other contaminants that might promote graphene growth during the subsequent CVD process. The deposition from the vapor phase will typically result in the seed molecules being deposited at random locations on the growth substrate. However, if desired, the growth substrate can be pretreated to control the deposition locations of the aromatic molecular seeds. For example, prior to the deposition, a coating can be applied over the surface of a substrate and openings can be patterned into the coating to expose the underlying growth substrate at the locations where the aromatic molecular seeds are to be deposited. Suitable coatings include organic coatings, such a poly(methyl methacrylate) (PMMA), and inorganic coatings, such as $SiO_2$, $GeO_2$, or other metal oxide. After the deposition of the aromatic molecular seeds, the coating can be removed. Alternatively, an STM tip can be used to selectively remove atoms from the surface of the growth substrate (e.g., to remove H atoms from a H-passivated Ge(001) surface) at defined locations, creating surface defects. The aromatic molecular seeds will then adsorb selectively at these defects.

Once the aromatic molecular seeds have been deposited onto the surface of the growth substrate, CVD growth of graphene is carried out under conditions that promote anisotropic directional growth of graphene nanoribbons, where the aromatic molecular seeds initiate the growth process. When a (001) surface is used, the resulting graphene nanoribbons may have armchair edge structures and their long axes aligned along a <110> direction of the growth substrate. For the purposes of this disclosure, the long axis of a graphene nanoribbon does not have to be perfectly aligned with (i.e., have a 0° rotation with respect to) a specific [110] direction of the substrate surface in order to be considered aligned along that direction. Small rotational deviations may stem from, for example, an initial rotation in the growth direction that becomes energetically unfavorable as the nanoribbons grow. A graphene nanoribbon may be considered to be aligned along (or aligned with) a specific [110] direction if its long axis is rotated by no more than about ±15° from the [110] direction of the growth surface. This includes graphene nanoribbons that are rotated by ±5°, or less, from the [110] direction of the growth surface.

The anisotropic graphene nanoribbon growth can be carried out using methane as the precursor gas, although other hydrocarbons can be used. Other such hydrocarbons include ethylene, acetylene, toluene, and benzene. Methane is generally a good choice because it decomposes slowly, leading to a slow graphene growth rate, which is desirable for anisotropic growth.

Optionally, the carbon atoms of the precursor gas molecules and the carbon of the aromatic molecular seeds can be different isotopes of carbon. For example, $^{12}C$ may be present in the aromatic molecular seeds, while $^{13}C$ can be used in the precursor gas molecules, or vice versa. The use of a different carbon isotope in aromatic molecular seeds is another way of creating compositional variation in a graphene nanoribbon with positional control. As in the case of the metal "defects" provided by metal-phthalocyanines, inverse isotope labeling of the seeds and the graphene nanoribbons grown therefrom may be of interest due to the long-lived nuclear spin lifetimes of $^{13}C$.

CVD conditions that promote anisotropic growth of graphene are illustrated in U.S. Pat. Nos. 9,324,804 and 9,761,669. Key parameters for realizing anisotropic growth are the mole fractions of the precursor molecules and the carrier molecules used in the CVD gas mixture, where the mole fractions can be adjusted by adjusting the partial pressures of the precursor and a carrier gas, such as $H_2$. By way of illustration only, seed-mediated anisotropic growth of nanoribbons from a mixture of $H_2$ and $CH_4$ can be achieved at certain combinations of temperatures in the range from about 860 to 935° C., $H_2$ mole fractions in the range from about $5.0 \times 10^{-3}$ to 0.33, and $CH_4$ mole fractions in the range from about $3.0 \times 10^{-5}$ to $2.0 \times 10^{-2}$. Guidance for selecting an appropriate combination of temperatures and mole fractions (partial pressures) is provided in the Example, below. In general, nanoribbon growth is favored by a high $H_2$ mole fraction and low $CH_4$ mole fraction, which correspond to a slow growth rate. For example, in some embodiments of the growth methods, the growth conditions are selected to provide nanoribbon width growth rates of no greater than 50 nm/hr. This includes embodiments in which the growth conditions are selected to provide width growth rates of no greater than 30 nm/hr, further includes embodiments in which the growth conditions are selected to provide width growth rates of no greater than 10 nm/hr, and still further includes embodiments in which the growth conditions are selected to provide width growth rates of no greater than 5 nm/hr. At these nanoribbon width growth rates, the nanoribbon length growth rate will be substantially faster. The growth time also plays a role in determining the dimensions of the CVD-grown graphene nanoribbons. Generally, as growth time is decreased, narrower, shorter nanoribbons are formed. Therefore, by using such slow growth rates and tuning the duration of the growth time, nanoribbons with desired lengths and widths can be selectively grown using bottom-up CVD growth.

During CVD growth, the graphene may initially grow isotropically from the edges of the aromatic molecular seeds until the growing construct has reached a certain size, at which point it serves as a molecularly-derived seed for anisotropic growth. It is also possible that multiple aromatic molecular seeds in close proximity on the surface might aggregate together to form a cluster, which serves as a molecularly-derived seed for the subsequent anisotropic growth from the edges of the cluster. Although these types of molecularly-derived seeds have dimensions that are larger than the original aromatic molecular seeds, they are still very small and, therefore, are capable of seeding the growth of very narrow nanoribbons. The size of these somewhat larger molecularly-derived seeds will depend on the particular aromatic molecular seeds from which they are formed. However, molecularly-derived seeds with lateral dimensions of less than 2 nm can be achieved, as illustrated in the Example.

For some aromatic molecular seeds and growth surfaces, anisotropic graphene growth may occur along equivalent <110> directions on the growth surface. If this occurs, two orientations of nanoribbons may grow from the seeds with their graphene crystal lattices oriented along two equivalent <110> directions of the (001) surface. If this is undesirable, selective growth along a single [110] direction can be achieved by using a vicinal growth surface. A vicinal surface can be made by miscutting the growth surface of the substrate surface toward the [110] direction, such that a series of parallel (001) faceted terraces, separated by steps that are a multiple of two atomic layers in height, are formed. The graphene nanoribbons are grown with a parallel alignment along the terraces. For example, the steps can be two, four, six, eight, ten, etc., atomic layers in height. The terraces can be formed using a miscut angle of, for example, about 9° or higher in order to provide steps that are two atomic layers high.

The graphene nanoribbons are generally characterized by lengths that exceed their widths (i.e., aspect ratio>1) and two long edges that run substantially parallel with each other. In addition, the graphene nanoribbons are characterized by the armchair crystallographic direction of graphene running substantially parallel to the long nanoribbon axis and along the edges. The phrase 'substantially parallel' is used in recognition of the fact that the edges may be parallel on a global scale, but might include edge portions that deviate slightly from perfectly parallel on an atomic scale due to edge roughness. Using the present methods, a plurality of graphene nanoribbons having armchair edges and high aspect ratios can be grown with a very low size polydispersity. For example, graphene nanoribbons having aspect ratios of at least 4, at least 10, at least 20, and at least 30 (e.g., in the range from 10 to 40) can be grown.

The width of the nanoribbons corresponds closely to the width of the seed particles, although the nanoribbons may be slightly wider than their seeds by the end of the nanoribbon growth process. In some embodiments, the average width of the graphene nanoribbons in the plurality of nanoribbons is no greater than 20 nm. This includes embodiments in which the average width of the graphene nanoribbons in the plurality of nanoribbons is no greater than 10 nm, and further includes embodiments in which the average width of the graphene nanoribbons in the plurality of nanoribbons is no greater than 5 nm. The mean normalized standard deviation for the widths of a plurality of graphene nanoribbons grown according to the methods described herein, and having aspect ratios with the ranges recited herein, can be 20% or smaller, including 15% or smaller, and 10% or smaller. By way of illustration, mean normalized standard deviations for the widths in the range from about 7% to about 15% can be achieved.

Example

Figure 1B:
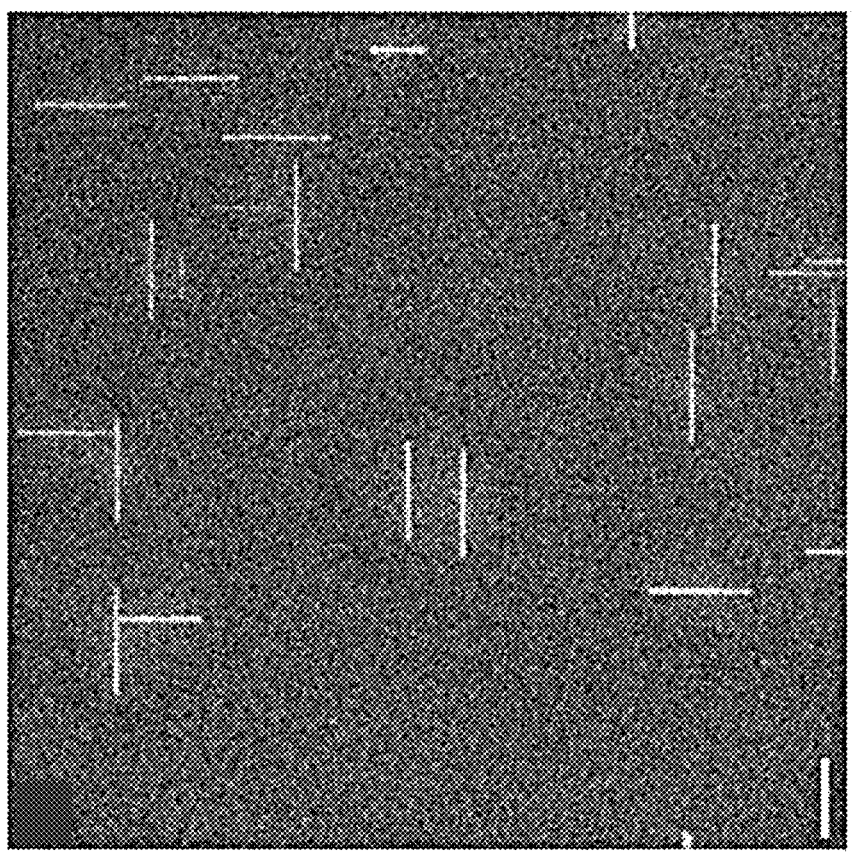

The strategy for synthesizing nanoribbons from PAH-derived seeds is illustrated in FIG. 1A and comprised of two stages: (i) initiation and (ii) anisotropic growth. In (i), PAHs were sublimed onto Ge(001) at relatively low temperature to initiate the subsequent synthesis of nanoribbons during stage (ii). Here, PTCDA and pentacene were employed as model PAHs because of their planarity and relatively low sublimation temperature. In stage (ii), $CH_4$ was flowed through the CVD reactor at high temperature to anisotropically evolve nanoribbons from PAH-derived seeds. Briefly, the synthesis was carried out as follows. The Ge(001) substrate was annealed in a furnace in an atmosphere of 67% Ar and 33% $H_2$ at 920° C. for 1.5 h. The furnace was slid away from the substrate and the whole system was decreased to room temperature. A temperature gradient was created in the furnace. In the case of PTCDA, $T_1$=220° C., $T_2$=180° C., and $T_3$=165° C. The furnace was slid back over the substrate and the gradient was stabilized. A quartz boat filled with PAH powder was pushed into the zone at $T_1$, which was the sublimation temperature of the PAH, while the substrate was at $T_3$, which was lower than the sublimation temperature and promoted deposition on the substrate. The furnace was slid away from the boat and substrate to stop sublimation, and the substrate was cooled to room temperature. Additionally, $CH_4$ was introduced into the system, and the furnace temperature was increased to the growth temperature of 920° C. The furnace was slid over the substrate to begin growth at 920° C. in an environment of 66% Ar, 33% $H_2$, and 0.56% $CH_4$. After the desired $CH_4$ exposure time (which was used to control the width and length of the nanoribbons), the furnace was slid away from the substrate to terminate growth. Examples of 12 nm wide nanoribbons initiated from PTCDA-derived seeds are shown in FIG. 1B after 173 min of $CH_4$ exposure at growth temperature. These molecularly seeded nanoribbons self-oriented along Ge(110) and had a large aspect ratio (e.g., 28 in FIG. 1B), similar to nanoribbons that spontaneously grew on Ge(001) without seeds.

Two conditions that facilitated initiating the synthesis of nanoribbons from PAH-derived seeds were (1) implementing the growth stage in a regime in which spontaneous nucleation was suppressed but anisotropic graphene evolution from existing seeds and domains was promoted, and (2) controlling PAH dose. To meet these conditions, the general procedure was as follows. First, the Ge substrates were annealed in 33% $H_2$ balanced by Ar at 920° C. to remove carbon-based contaminants prior to PAH deposition. Removing these contaminants suppressed spontaneous nucleation, avoiding the unwanted initiation of nanoribbons by $CH_4$ alone during the later growth stage. Second, PAHs were deposited by cooling the Ge substrates to 165° C. (for PTCDA) or 125° C. (for pentacene) and subliming the PAHs onto the Ge from an upstream quartz crucible containing PAH powder at 220° C. (for PTCDA) or 160° C. (for pentacene). The dose can be generally controlled via crucible temperature, which affects the vapor pressure of the PAH, and/or sublimation time. After dosing the Ge with PAHs, the reactor was cooled to room temperature, $CH_4$ was introduced into the gas stream, and the temperature was rapidly increased (over 5 min) to 920° C. to promote graphene nanoribbon evolution. On annealed Ge(001) surfaces, a window of growth conditions existed at $CH_4$ concentrations between 0.5 and 0.9% (at an $H_2$ concentration of 33%), in which nanoribbon growth can be driven from seeds without appreciable spontaneous nucleation. In the data below, a $CH_4$ concentration of 0.56% was utilized, intentionally chosen near the bottom of this range to exploit the fact that growth rate anisotropy increased with decreasing $CH_4$ concentration on Ge(001), thereby yielding nanoribbons with high-aspect ratio.

Control experiments adopting this protocol, but eliminating the deposition of PAHs, failed to appreciably yield nanoribbons, confirming that nanoribbons are unable to spontaneously nucleate from the supply of $CH_4$, alone, in the absence of PAH-derived seeds. Likewise, control experiments adopting this protocol, but forgoing the delivery of $CH_4$ to the Ge substrate, show that PAHs themselves are unable to form nanoribbons. These two experiments verify that seed formation during the initiation stage and nanoribbon synthesis during the anisotropic growth stage are distinct processes that can be independently controlled. Nanoribbon density increases with increasing PAH sublimation dose during the initiation stage until the density becomes so high that nanoribbons begin to grow into each other, beyond which higher doses of PAHs template the synthesis of disordered carbon films rather than graphene nanoribbons. It is also worth noting that, without the introduction of PAHs, a short burst of $CH_4$ (above the $CH_4$ concentration needed to induce spontaneous nucleation) primarily initiated the synthesis of polydisperse, low-aspect ratio graphene crystals. These low-aspect ratio features rapidly evolved during the burst, likely because of the super-linear dependence of growth rate on $CH_4$ partial pressure, as opposed to forming homogenous sub 2 nm graphene seed crystals capable of initiating the uniform synthesis of nanoribbons.

FIGS. 2A-2L evidence that the width and length of the nanoribbons can be intentionally controlled by varying $CH_4$ exposure time, that nanoribbons effectively initiate growth from seeds that are only 1.7 nm in diameter, and that nanoribbons with aspect ratio greater than 10 and width as narrow as 2.6 nm can be realized. FIGS. 2A-2E show SEM images of nanoribbons initiated from PTCDA-derived seeds after various $CH_4$ exposure times. The nanoribbons were too small to clearly resolve via SEM after 6 and 19 min of exposure in FIGS. 2A-2B but were more easily imaged after 46, 72, and 98 min of exposure in FIGS. 2C-2E. The nanoribbons became wider and longer with increasing $CH_4$ exposure time.

Scanning tunneling microscopy (STM) was used to image the nanoribbons with higher resolution and quantify their width and length (see representative images in FIGS. 2F-2J). The width linearly increased with exposure time and was 2.1±0.3, 2.6±0.4, 3.6±0.6, 4.9±0.7, and 6.1±0.9 nm after 6, 19, 46, 72, and 98 min of exposure, respectively (FIG. 2K, with width histogram distributions in FIGS. 3A-3E). One goal of molecular scale seeding is to gain control over nanoribbon width by tailoring $CH_4$ concentration or exposure time. Here, the change in width with respect to time was remarkably slow, only 2.6 nm $h^{-1}$, enabling precise control over nanoribbon width by tailoring $CH_4$ exposure time.

Figure 4A:
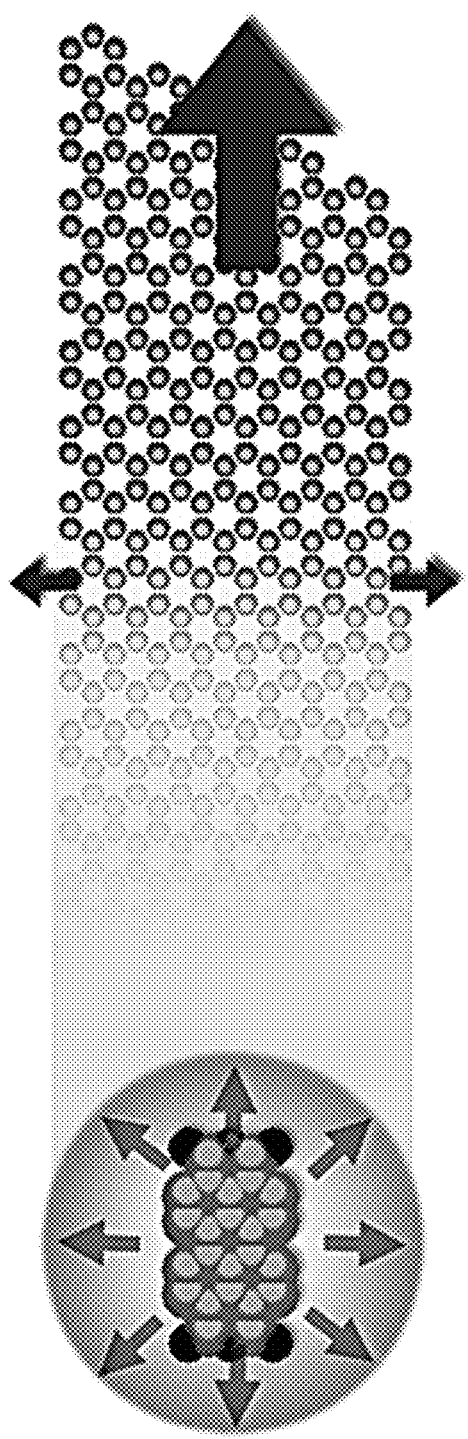
FIGS. 4A-4B show schematic depictions of two possible nanoribbon initiation pathways from PAH-derived seeds.
Figure 4B:
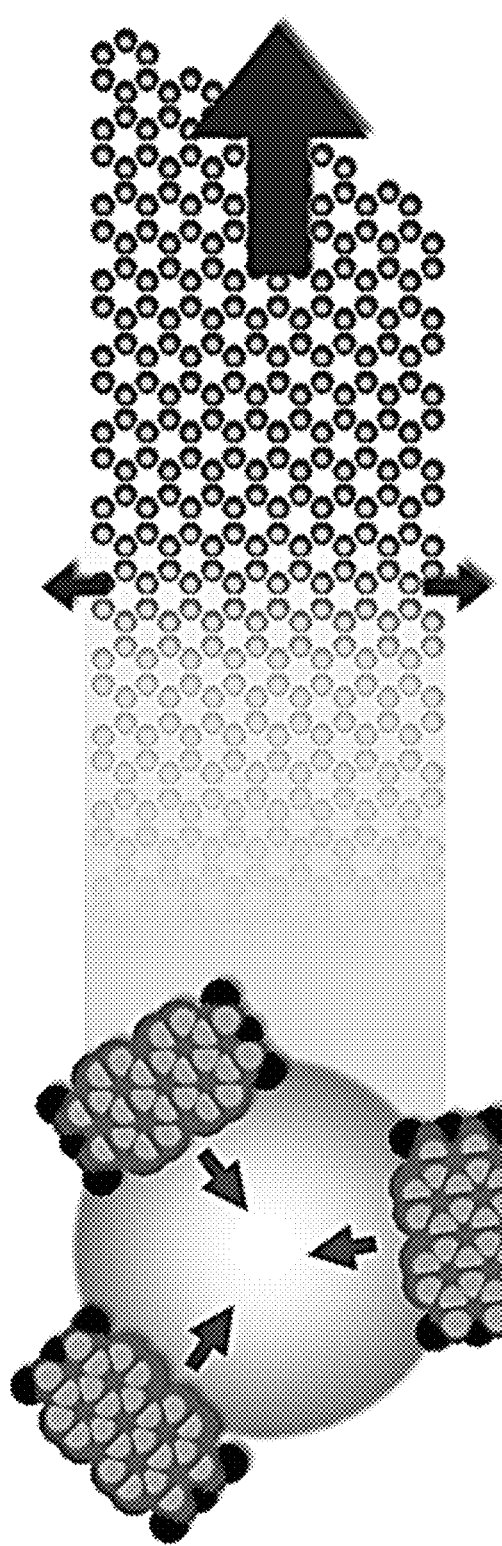

Extrapolating a best-fit line to an exposure time of 0 min yielded an estimate of 1.7 nm for the effective seed size prior to $CH_4$ exposure. Different growth modes are possible. One possibility is that individual PAH molecules or fragments of PAH molecules grew relatively isotropically to an effective seed size of 1.7 nm before anisotropic growth began (as depicted in FIG. 4A). Another possibility is that multiple PAH molecules or fragments of PAH molecules clustered to form seeds that were effectively 1.7 nm in diameter that then templated the anisotropic growth of nanoribbons (as depicted in FIG. 4B).

Figure 2L:
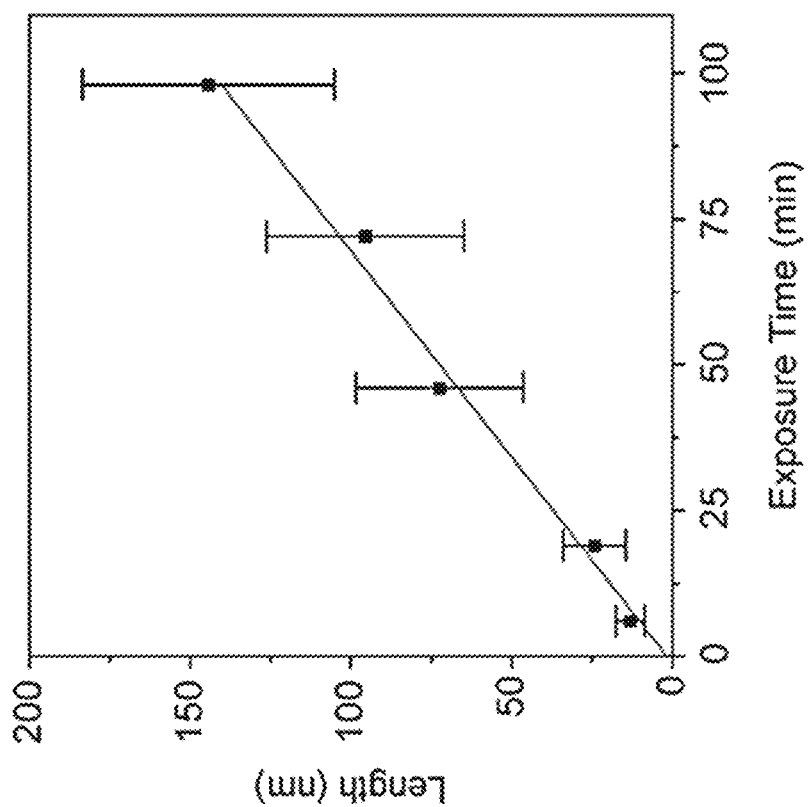
Figure 2K:
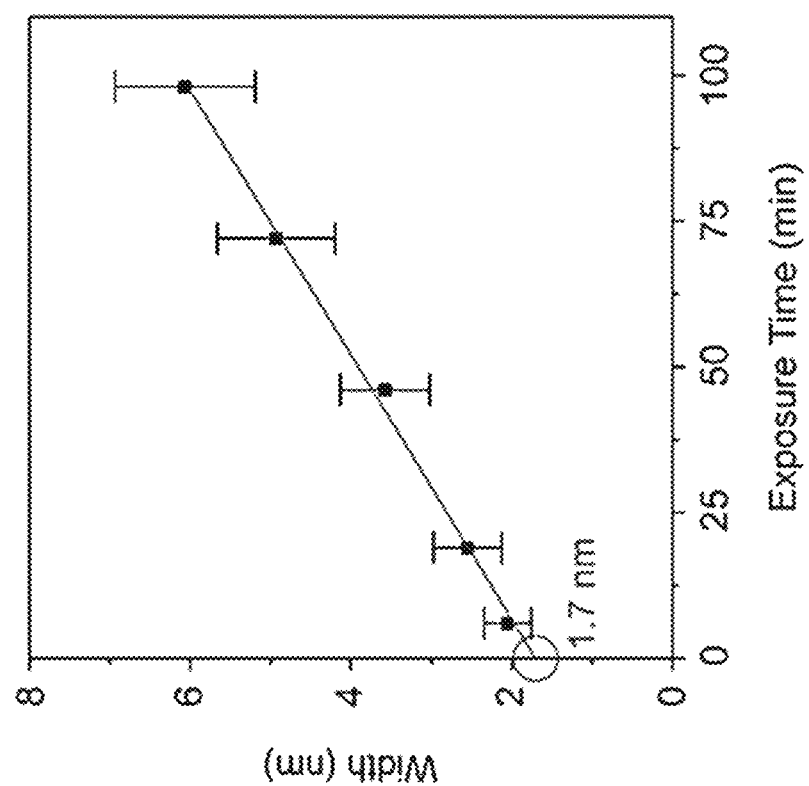

Interestingly, a bimodal length distribution was consistently observed, indicating two modes of growth along the nanoribbon long axis. Considering both modes, the nanoribbon length increased linearly with exposure time and was 13±4.5, 24±9.7, 72±26, 95±31, and 144±39 nm after 6, 19, 46, 72, and 98 min of exposure, respectively (FIG. 2L). This bimodal distribution was most clearly resolved after longer exposure times. A minority of the nanoribbons (about 30%) were about one-half the length of the others, indicating that the majority population grew bidirectionally whereas the minority population grew unidirectionally away from seeds. The length of the bidirectional population of nanoribbons increased at a rate of 98 nm $h^{-1}$. The aspect ratio of the bidirectional nanoribbons increased with increasing exposure time, exceeding 12 at a width of 2.6 nm after 19 min and reaching 33 at a width of 8.5 nm after 173 min (FIGS. 5A-5E). The increase in aspect ratio with time occurred because the seeds began as low-aspect ratio structures with non-zero widths. The nanoribbons then evolved anisotropically from the seeds with a growth rate in the length direction that was 32 times the growth rate in the width direction (for the case of bidirectional nanoribbons).

Figure 6A:
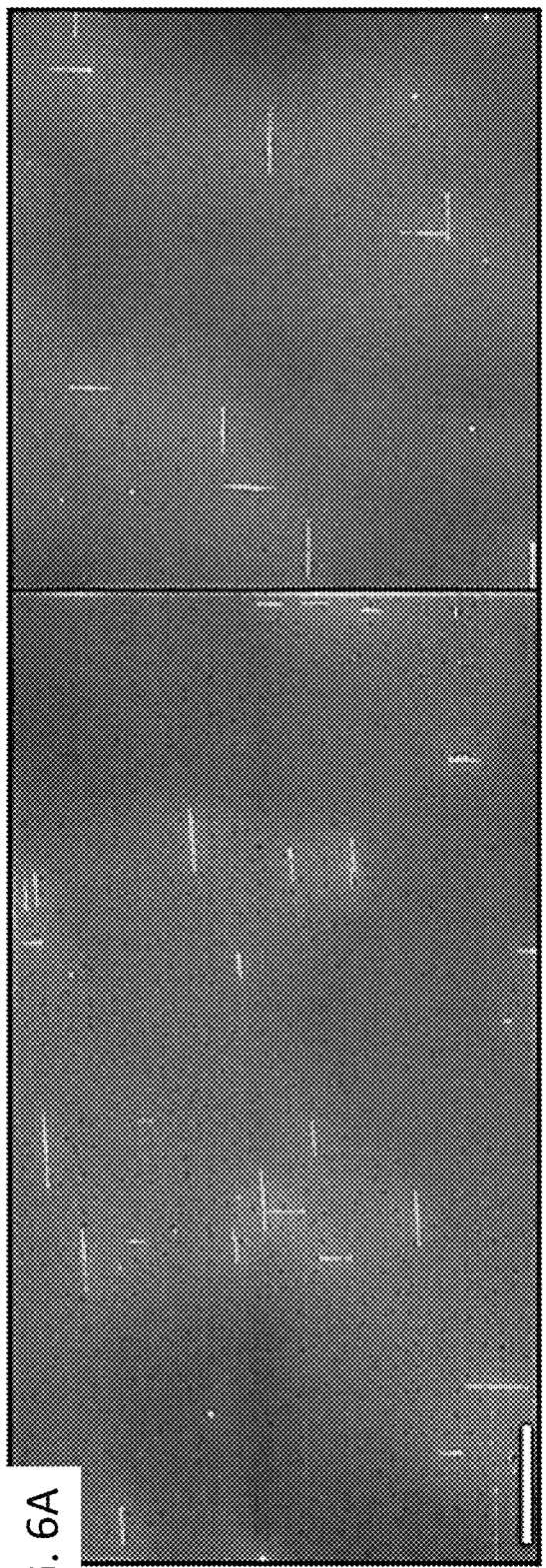
FIGS. 6A-6F show width distribution data.
Figure 6B:
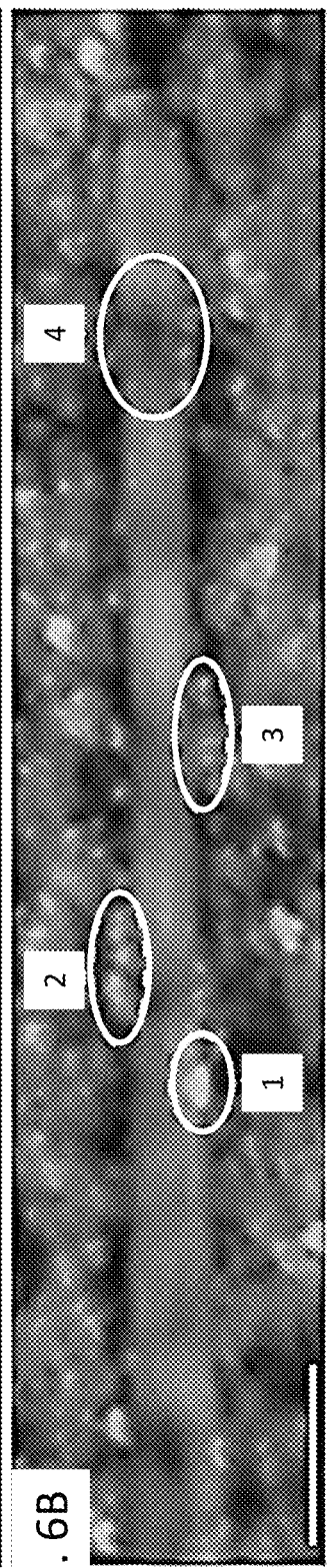
Figure 6C:
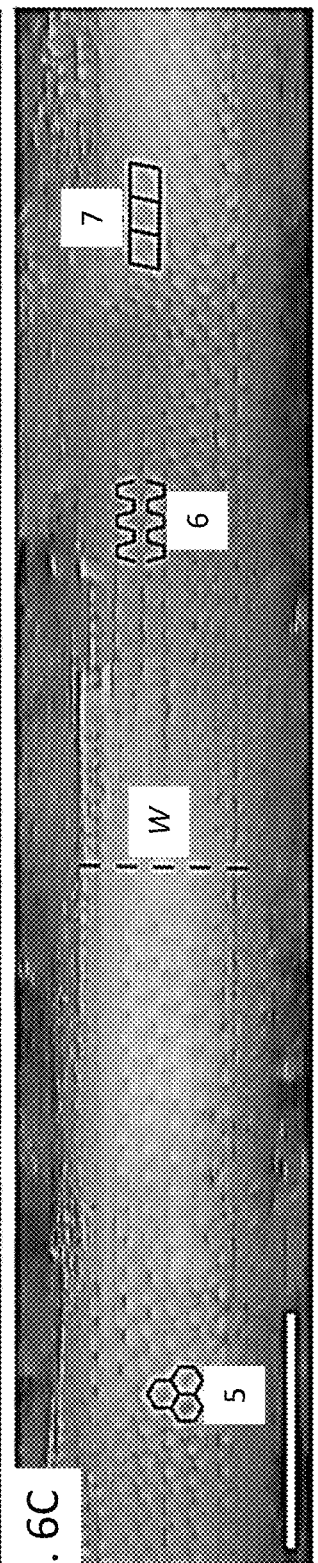
Figure 6F:
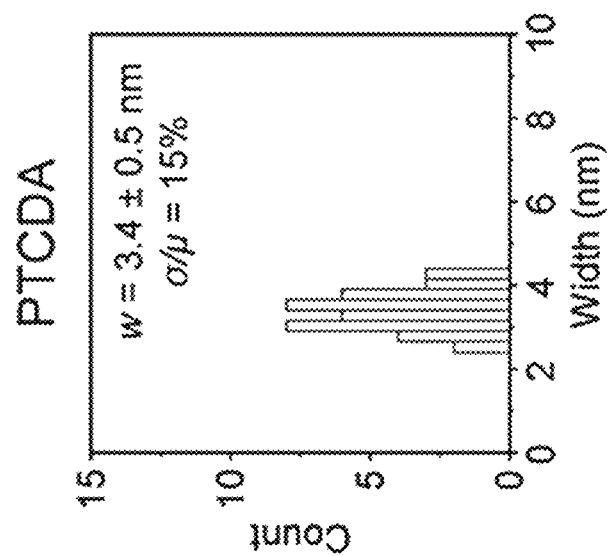
Figure 6E:
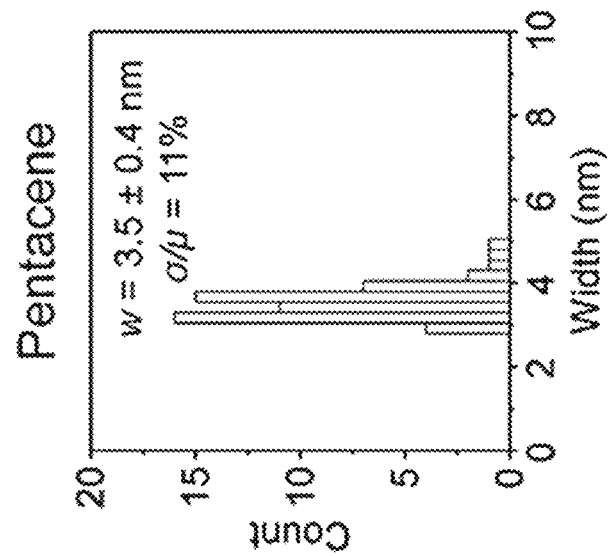
Figure 6D:
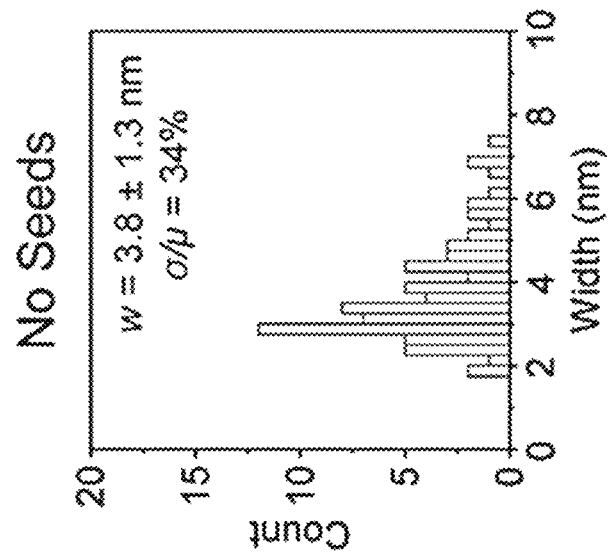
Figures 7A, 7B, 7C:
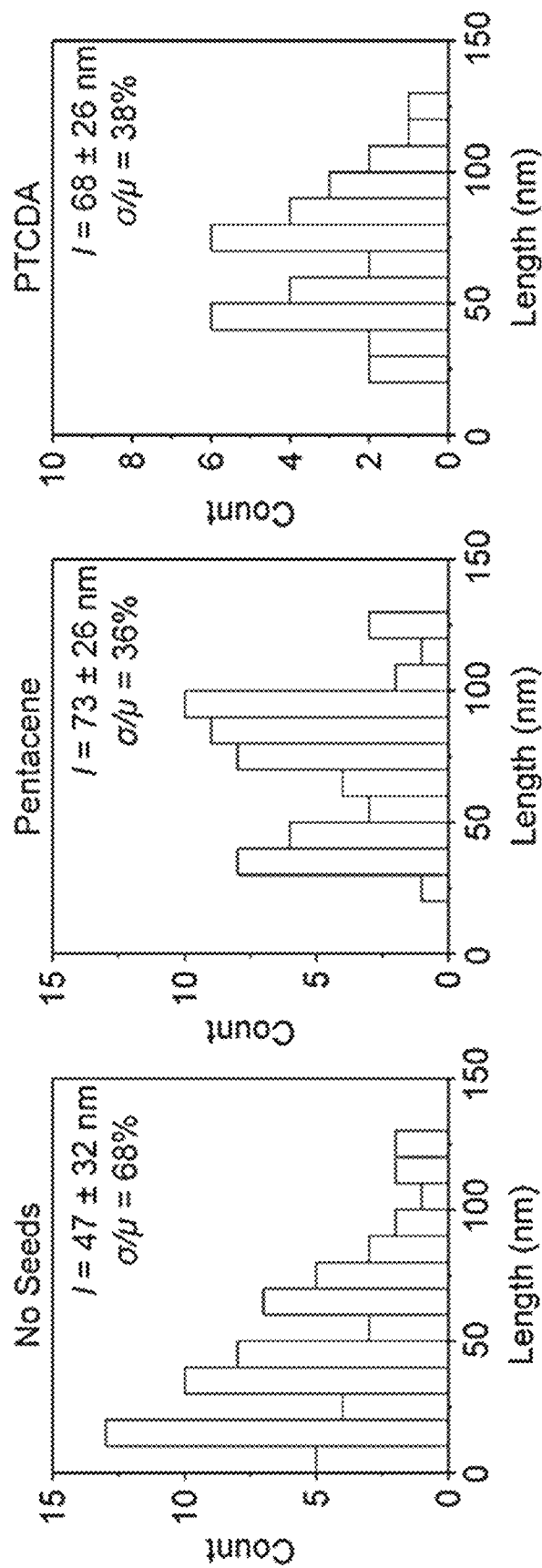
FIGS. 7A-7F show further characterization of nanoribbon samples analyzed in FIGS. 6A-6F. Length and aspect ratio histograms for nanoribbons initiated without seeds (FIG. 7A, 7D), via pentacene-derived seeds (FIG. 7B, 7E), and via PTCDA-derived seeds (FIGS. 7C, 7F). The mean, standard deviation, and polydispersity ($\sigma/\mu$) are indicated in each panel.
Figures 7D, 7E, 7F:
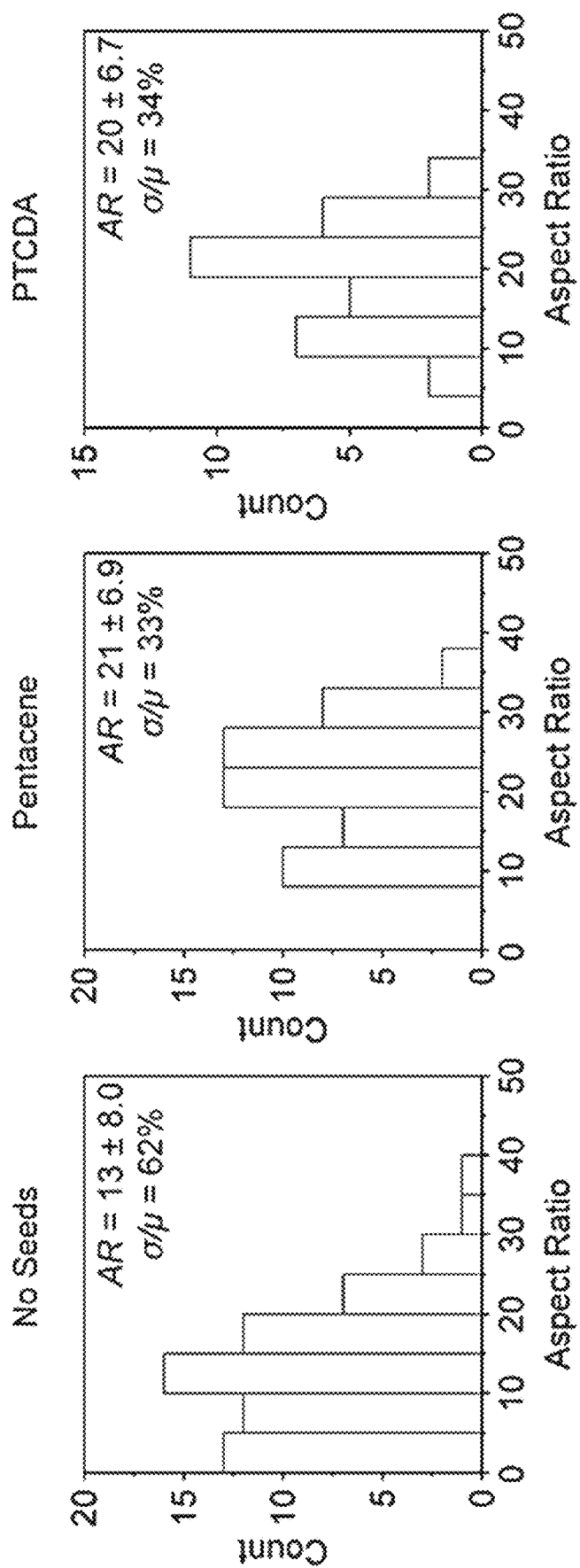

FIGS. 6A-6F quantify the improvement in width polydispersity that resulted from initiating nanoribbon growth from PAH derived seeds. Here, unseeded nanoribbons initiated by spontaneous nucleation were compared to nanoribbons initiated from pentacene- and PTCDA-derived seeds—all after 46 min of evolution from $CH_4$. The unseeded nanoribbon substrates were prepared by reducing the duration of the pre-synthesis 920° C. anneal in 33% $H_2$ from 90 to 15 min, to enable spontaneous nucleation, and then forgoing PAH deposition. STM scans with a pixel size ranging from 0.1 to 0.2 nm were collected to characterize the width of 74, 40, and 58 different nanoribbons from unseeded, PTCDA-initiated, and pentacene-initiated samples, respectively. Large-area scans are shown in FIG. 6A; higher magnification scans are presented in FIGS. 6B-6C; and, histograms of the width distributions are shown in FIGS. 6D-6F. The unseeded nanoribbons had a width of 3.8±1.3 nm (corresponding to a mean normalized standard deviation of 1.3 nm/3.8 nm=34%). In contrast, the widths of the pentacene- and PTCDA-initiated nanoribbons were 3.5±0.4 nm and 3.4±0.5 nm, corresponding to mean-normalized standard deviations of 11 and 15%, respectively. Thus, the width polydispersity of molecularly seeded nanoribbons was substantially better than nanoribbons that spontaneously nucleated without seeds. Without seeds, nucleation was likely driven by carbon-based contaminants (that would otherwise be removed with additional $H_2$ annealing), and the resulting nanoribbon polydispersity can therefore be attributed to non-uniformities associated with these contaminants in addition to variation in nucleation time. In contrast, the PAH-derived seeds more simultaneously and uniformly initiated the synthesis of nanoribbons. Like the width polydispersity, the length polydispersity of the bidirectional population of nanoribbons was roughly 10%. Histograms of the length and aspect ratio of the nanoribbons analyzed in FIGS. 6A-6F are provided in FIGS. 7A-7F.

The observation of honeycomb, intervalley scattering with period of 0.35 nm (near the wavelength of electrons at the high-symmetry K-point of the first Brillouin of graphene, $\lambda_f$, of 0.37 nm), and √3 quasiparticle interference patterns in the nanoribbon interiors (FIG. 6C) confirms that the interiors of the nanoribbons are highly crystalline and demonstrates that electronic states are delocalized across the nanoribbon width. The observation of these patterns moreover confirms the armchair orientation of the nanoribbons.

Figure 8B:
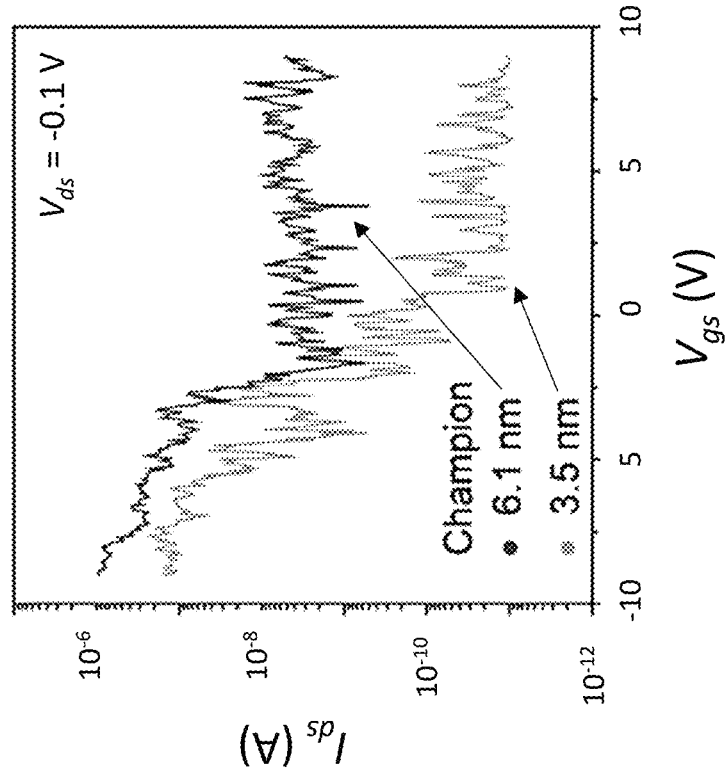
FIGS. 8A-8D show field-effect transistor (FET) measurements.
Figure 8A:
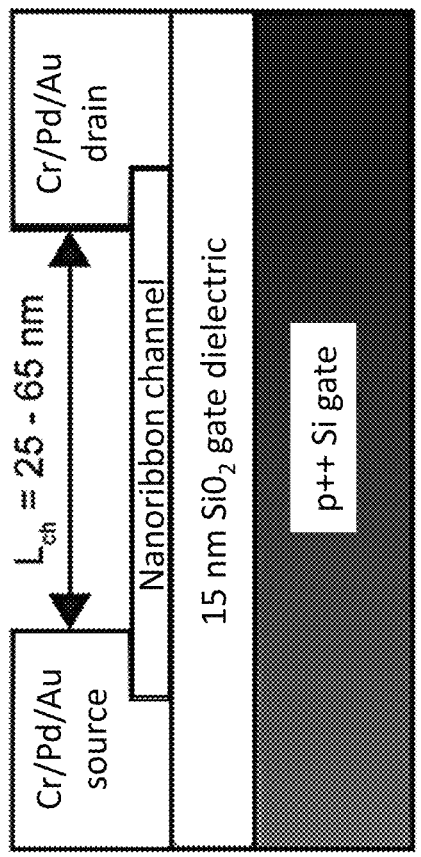
Figure 8D:
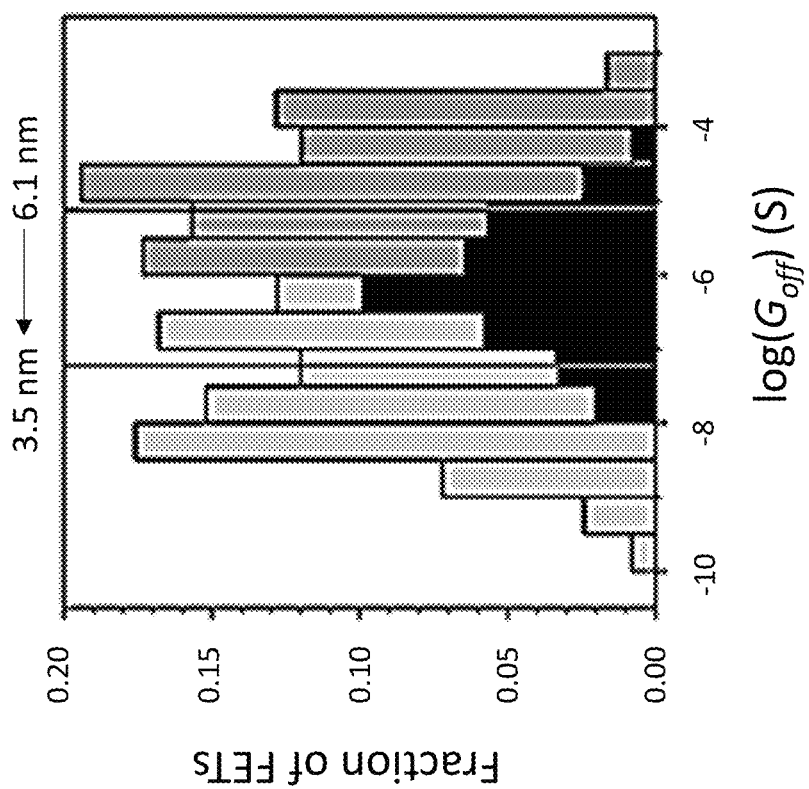
Figure 8C:
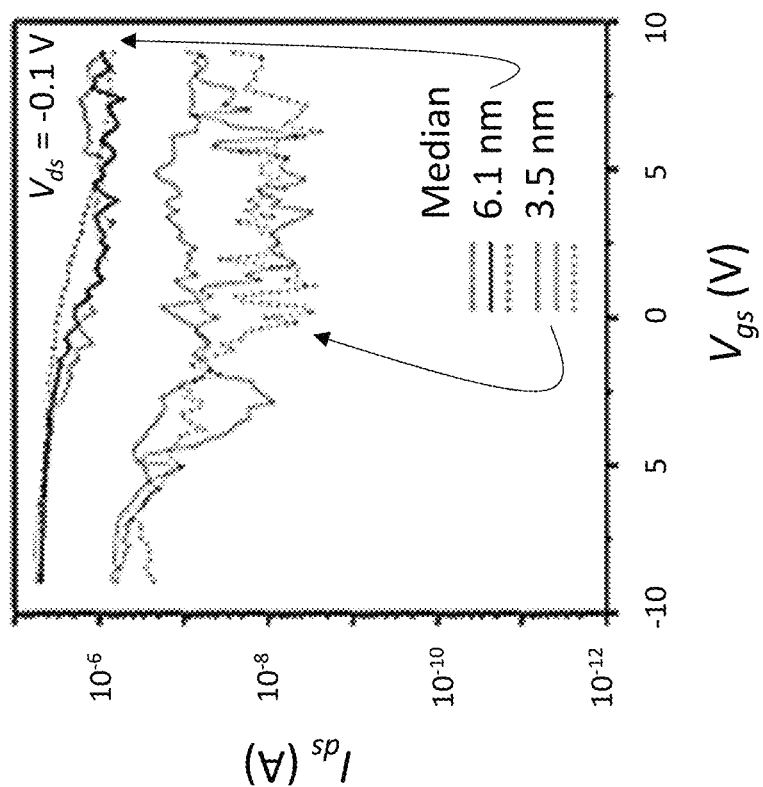

Two different populations of nanoribbons (width=3.5 nm, PTCDA-initiated, 46 min of $CH_4$ exposure; and, width=6.1 nm, PTCDA-initiated, 98 min of $CH_4$ exposure) were integrated into field-effect transistors (FETs) in FIGS. 8A-8D. The nanoribbons were transferred to degenerately doped Si wafers with 15 nm of thermally grown $SiO_2$, which served as a universal back-gate for the FETs. A sacrificial polymer film was used to transfer the nanoribbons from Ge to $SiO_2$, in conjunction with etching of the Ge growth substrate. After transfer, Cr/Pd/Au top-contacts with thickness of 0.7/9.3/10 nm were deposited by thermal evaporation to define a channel length of 25-65 nm (FIG. 8A). Source-drain current ($I_{ds}$) versus source-gate bias ($V_{gs}$) at a source-drain bias ($V_{ds}$) of −0.1 V was compared for champion (FIG. 8B) and median FETs (FIG. 8C). The devices turned on at negative $V_{gs}$, demonstrating p-type behavior, as expected for nanoribbon FETs with Pd contacts measured in ambient air at room temperature. The champion 3.5 nm nanoribbon FETs simultaneously exhibited high on/off ratio and high on-state conductance. For example, 13 FETs displayed an on/off ratio ranging from $1.1 \times 10^3$ to $8.1 \times 10^3$, in which the on-state conductance ranged from 1.6 to 6.5 μS, and the corresponding on-state conductance normalized by width ranges from 460 to 1800 μS μm$^{-1}$. More than 125 and 242 different 3.5 nm and 6.1 nm nanoribbon FETs, respectively, were measured, and histograms of off-state conductance are compared in FIG. 8D. The median off-conductance was suppressed by 2.2 orders of magnitude in the narrower ribbons, which were expected to exhibit smaller off-conductance because of their larger bandgaps and transport gaps.

Figure 9B:
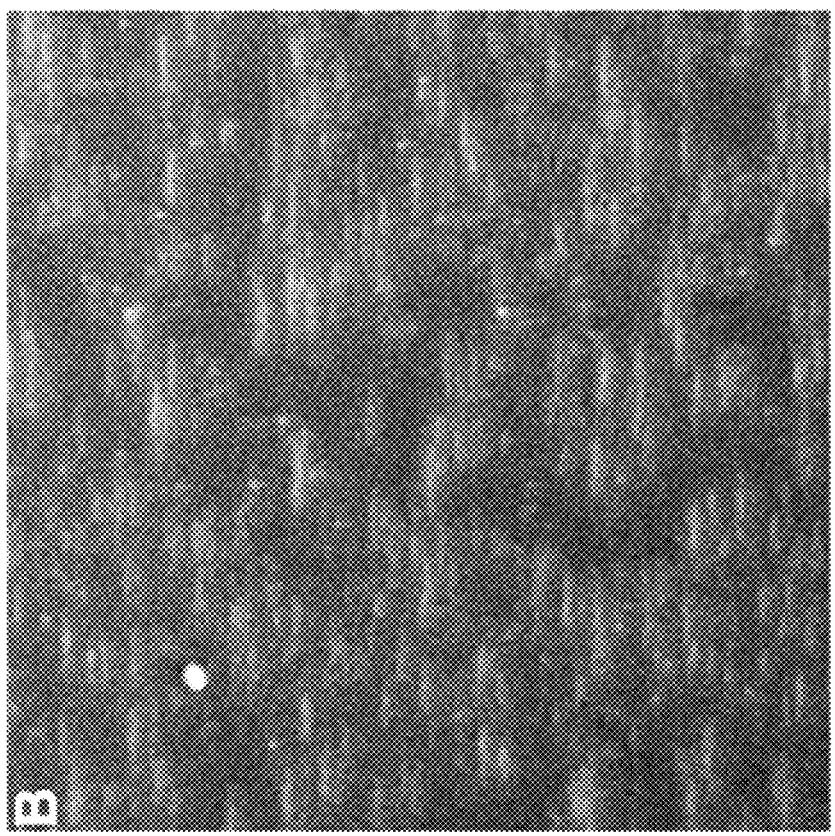
FIGS. 9A and 9B show SEM images of graphene nanoribbons grown from PTCDA-derived seeds on vicinal Ge(001) surfaces (with 9° miscut towards the Ge[110] direction) after 23 (FIG. 9A) and 53 (FIG. 9B) min of evolution using $CH_4$ as the precursor. Scale bar in (A) is 200 nm and applies to both images.
Figure 9A:
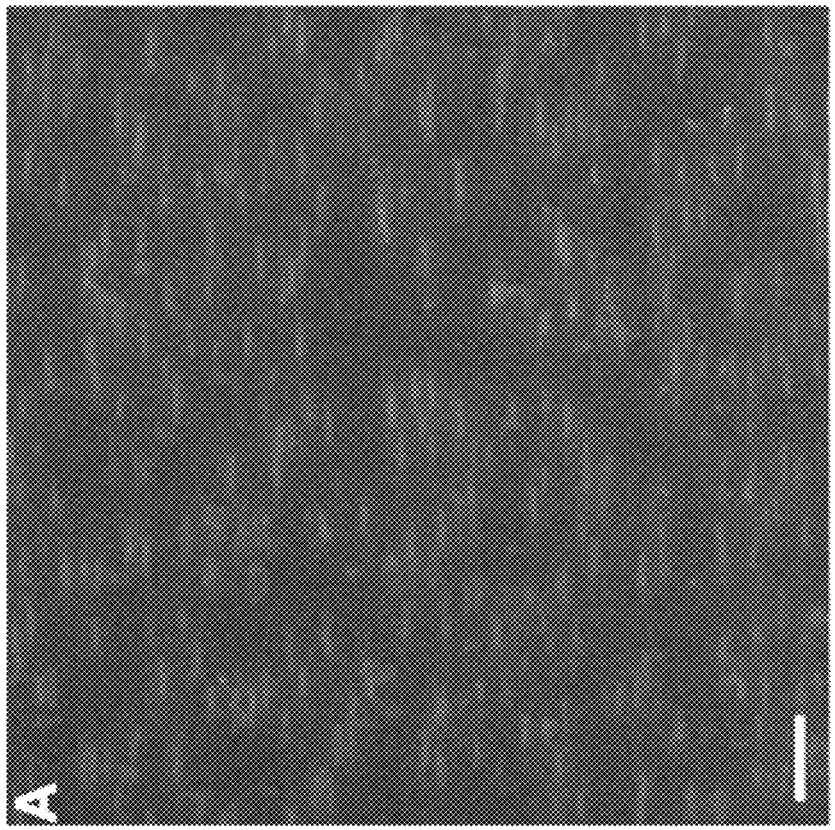

Finally, in order to demonstrate nanoribbon growth along a single [110] direction, graphene nanoribbons with a highly preferred orientation were grown by initiating CVD synthesis from PTCDA-derived seeds on a vicinal Ge(001) substrate (FIGS. 9A and 9B).

Experimental Methods

Preparation of the Ge(001) Surface. Ge(001) (Wafer World, resistivity>40 Ω-cm) was cleaved along Ge(110) directions into 1.0×0.75 cm$^2$ rectangular pieces using a diamond scribe. The substrates were loaded into a horizontal quartz tube furnace with an inner diameter of 34 mm and three heated zones. Next, the tube was evacuated to ~$10^{-4}$ torr for 10 min and then filled to atmospheric pressure via the flow of 200 sccm of Ar (purity of 99.999%) and 100 sccm of $H_2$ (purity of 99.999%). The substrates and all three zones of the furnace were heated to 920° C. under these flow conditions for 1.5 h. This duration was sufficient to suppress the spontaneous nucleation of nanoribbons during subsequent growth stages.

In-situ Deposition of Small Molecules. After annealing, the furnace and substrates were cooled to approximately room temperature. The substrates were heated to 165° C. (for PTCDA) or 125° C. (for pentacene) in the downstream zone of the furnace in an environment of 200 sccm of Ar and 100 sccm of $H_2$. Under the same environment, a quartz boat filled with a powder of either PTCDA (Luminescence Technology, LT-S920, sublimed grade>99%) or pentacene (Sigma-Aldrich, 684848, sublimed grade>99.9%) was inserted into the upstream zone of the furnace at 220° C. (for PTCDA) or 160° C. (for pentacene) without breaking the system's seal—to begin sublimation of the molecules. The dose of the molecule was varied by controlling the duration of sublimation (typically 20-30 min) before the PAH source material and substrates were rapidly cooled to room temperature.

Anisotropic Graphene Nanoribbon Growth via Chemical Vapor Deposition of $CH_4$. After sublimation of the small molecules, a flow of 200 sccm of Ar, 100 sccm of $H_2$, and 1.7 sccm of $CH_4$ (99.999%, 99.999%, and 99.99% purity, respectively) was established in the tube at room temperature. The furnace was on a sliding track. It was initially slid away from the substrates, and all zones were preheated to 920° C. The nanoribbon growth stage was then commenced by sliding the furnace over the substrates. As substrate temperature increased over the course of several minutes, nanoribbon evolution did not appreciably begin until the substrate temperature approached 920° C. due to the strongly activated nature of graphene growth on Ge(001). To quantify when nanoribbon evolution effectively begins, the fact that nanoribbon length increases linearly with time was used. Nanoribbon length versus time elapsed was plotted after sliding the furnace over the substrates. These data were then fit to a line and were extrapolated to find when the nanoribbons effectively began growing, which was defined as occurring when the length of the nanoribbons was equivalent to the characteristic seed size of 1.7 nm (i.e., when the length and width were both the size of the characteristic seed). The nanoribbons effectively began growing 7 minutes after sliding the furnace over the substrate. Therefore, this instance was defined 7 minutes after sliding the furnace as time=0 for nanoribbon evolution. All $CH_4$ exposure times specified throughout the manuscript are specified with respect to this instance (i.e., the specified $CH_4$ exposure time was 7 minutes less than the time elapsed since sliding the furnace). The growth stage was terminated by sliding the furnace away from substrates to rapidly cool them in the same environment.

Microscopy. After growth, the samples were characterized via SEM (Zeiss LEO 1530) to acquire basic length, width, and density information. STM was performed by transferring the nanoribbon samples through ambient air to a nitrogen glovebox, where they were sealed. The samples were later mounted to sample holders, loaded into an ultra-high vacuum preparation chamber where they were annealed for 12 h at 400° C., and imaged by STM (Omicron VT, base pressure of $1 \times 10^{-11}$ mbar). The STM imaging was performed at room temperature using electrochemically etched W tips. Scanning tunneling spectroscopy was performed using a lock-in amplifier with a dither frequency of 10 kHz and modulation amplitude of 30 mV.

Fabrication and Characterization of Graphene Nanoribbon FETs. After synthesis, the nanoribbons were transferred to $SiO_2$ on Si with a copolymer of crosslinkable poly(methyl methacrylate) (PMMA). (Liu, C.-C. et al., Macromolecules, 2011, 44 (7), 1876-1885.) The copolymer, which was polymerized from 96 mol % methyl methacrylate (MMA) with 4 mol % of thermally crosslinkable glycidyl methacrylate (GMA), PMMA-GMA (96% PMMA, 4% GMA), was spin-coated on the sample, and the films were thermally annealed at 160° C. for 3 h in a vacuum to promote better bonding of the copolymer with the nanoribbon/Ge substrate. Excess polymer was removed by rinsing in toluene, resulting in a film that was 3 to 5 nm in thickness. Additional PMMA was spin-coated on top of the PMMA-GMA film, and the substrate was annealed at 160° C. for 5 hours in an $N_2$ environment (<1 ppm $O_2$ and <1 ppm $H_2O$). The backside of the sample that was uncoated with polymer underwent an $O_2$ plasma etch (50 W, 10 mTorr, 10 sccm of $O_2$) for 3 min (Unaxis 790 Reactive Ion Etcher) to remove graphene. The sample was then floated on 3:1:1 $H_2O:HF:H_2O_2$ to etch the Ge substrate. The nanoribbon/polymer membrane was transferred from the Ge etchant to three successive $H_2O$ baths and finally to a piranha cleaned $SiO_2$ (15 nm) on Si substrate. The substrate was spin dried and then annealed at 120° C. for 3 min in an $N_2$ environment (<1 ppm $O_2$ and <1 ppm $H_2O$). The substrate was soaked in acetone at room temperature for ~1 h and was subsequently thermally annealed in a horizontal quartz tube furnace at 400° C. for 1 h at ~$10^{-6}$ torr to remove polymer residue.

To fabricate graphene nanoribbon field-effect transistors, source and drain contacts were patterned via electron-beam lithography, development, and thermal evaporation of Cr/Pd/Au (thicknesses of 0.7/9.3/10 nm). The 15 nm of $SiO_2$ was used as the gate dielectric, and the degenerately doped Si substrate served as the back gate electrode. Devices were measured in ambient laboratory conditions at room temperature using a Keithley 2636A SourceMeter. The transistors exhibited hysteresis in the $I_{ds}$ versus $V_{gs}$ characteristics.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of growing graphene nanoribbons, the method comprising:
depositing aromatic molecular seeds from the gas phase onto a surface of a growth substrate; and growing graphene nanoribbons from the aromatic molecular seeds via chemical vapor deposition.

2. The method of claim 1, wherein the growth substrate is a germanium substrate.

3. The method of claim 1, wherein the aromatic molecular seeds comprise polycyclic aromatic hydrocarbons (PAHs), functionalized derivatives of PAHs, heterocyclic aromatic molecules, metal complexes of heterocyclic aromatic molecules, or a combination thereof.

4. The method of claim 3, wherein the graphene nanoribbons have a width of 5 nm or smaller.

5. The method of claim 4, wherein the graphene nanoribbons have aspect ratios of at least 10.

6. The method of claim 3, wherein the aromatic molecular seeds comprise perylenetetracarboxylic dianhydride, pentacene, or a combination thereof.

7. The method of claim 3, wherein the graphene nanoribbons are grown from the polycyclic aromatic hydrocarbons.

8. The method of claim 7, wherein the polycyclic aromatic hydrocarbons comprise pentacene.

9. The method of claim 3, wherein the graphene nanoribbons are grown from the metal complexes of heterocyclic aromatic molecules.

10. The method of claim 9, wherein the metal complexes of heterocyclic aromatic molecules comprise metal phthalocyanines.

11. The method of claim 1, wherein the surface is a (001) facet or a miscut (001) facet.

12. The method of claim 2, wherein the graphene nanoribbons have widths of 5 nm or smaller.

13. The method of claim 12, wherein the graphene nanoribbons have aspect ratios of at least 10.

14. The method of claim 13, wherein the growth substrate is a (001) facet or miscut (001) facet of the germanium substrate.

15. The method of claim 14, wherein the aromatic molecular seeds comprise polycyclic aromatic hydrocarbons (PAHs), functionalized derivatives of PAHs, heterocyclic aromatic molecules, metal complexes of heterocyclic aromatic molecules, or a combination thereof.

16. The method of claim 14, wherein the aromatic molecular seeds comprise polycyclic aromatic hydrocarbons (PAHs), metal complexes of heterocyclic aromatic molecules, or a combination thereof.

* * * * *